US012624456B2

(12) United States Patent
Kato

(10) Patent No.: US 12,624,456 B2
(45) Date of Patent: May 12, 2026

(54) FILM-FORMING METHOD AND FILM-FORMING APPARATUS

(71) Applicant: Tokyo Electron Limited, Tokyo (JP)

(72) Inventor: Hitoshi Kato, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 18/913,040

(22) Filed: Oct. 11, 2024

(65) Prior Publication Data

US 2025/0129482 A1 Apr. 24, 2025

(30) Foreign Application Priority Data

Oct. 24, 2023 (JP) ................................. 2023-182610

(51) Int. Cl.
*C23C 16/52* (2006.01)
*C23C 16/455* (2006.01)

(52) U.S. Cl.
CPC ........ *C23C 16/52* (2013.01); *C23C 16/45525* (2013.01)

(58) Field of Classification Search
None
See application file for complete search history.

(56) References Cited

U.S. PATENT DOCUMENTS

2020/0058499 A1* 2/2020 Kanemura ........ C23C 16/45578

FOREIGN PATENT DOCUMENTS

JP 2018-062703 4/2018
JP 2018062703 A * 4/2018

* cited by examiner

Primary Examiner — Michael P. Rodriguez
(74) *Attorney, Agent, or Firm* — IPUSA, PLLC

(57) ABSTRACT

A film-forming method for forming a film on a substrate includes: (A) forming the film on the substrate by, in a process chamber, rotating the substrate, moving one of the substrate or a nozzle gas discharge mechanism relative to another of the substrate or the nozzle gas discharge mechanism, and discharging a film-forming gas toward the substrate from the discharge hole of the nozzle gas discharge mechanism; and (B) after (A), adjusting a film thickness of the film formed on the substrate by, in the process chamber, rotating the substrate, moving one of the substrate or the nozzle gas discharge mechanism relative to another of the substrate or the nozzle gas discharge mechanism, and discharging an etching gas toward the substrate from the discharge hole of the nozzle gas discharge mechanism.

10 Claims, 16 Drawing Sheets

FILM-FORMING METHOD AND FILM-FORMING APPARATUS

CROSS-REFERENCE TO RELATED APPLICATIONS

This application is based upon and claims priority to Japanese Patent Application No. 2023-182610, filed on Oct. 24, 2023, the entire contents of which are incorporated herein by reference.

BACKGROUND

1. Field of the Invention

The present disclosure relates to a film-forming method and a film-forming apparatus.

2. Description of the Related Art

Known film-forming apparatuses are configured to rotate multiple wafers (substrates) held on a susceptor and supply multiple types of processing gases over the substrates, thereby forming desired films on the surfaces of the substrates. In recent years, in accordance with miniaturization and increasing performance of semiconductor devices, it is desirable to provide a film-forming method of forming a thin film having excellent in-plane uniformity in terms of film thickness.

For example, Japanese Patent Application Publication No. 2018-62703 discloses a film-forming apparatus in which gas supplies are disposed above, and correspondingly to, two horizontally aligned substrates in a process chamber. This film-forming apparatus is configured to rotate each of the gas supplies about a shaft between the two substrates and discharge gas to the individual substrates, thereby forming films.

SUMMARY

One aspect of the present disclosure provides a film-forming method for forming a film on a substrate. The film-forming method includes: (A) forming the film on the substrate by, in a process chamber, rotating the substrate, moving one of the substrate or a nozzle gas discharge mechanism relative to another of the substrate or the nozzle gas discharge mechanism such that a discharge hole of the nozzle gas discharge mechanism passes over a center of the substrate, and discharging a film-forming gas toward the substrate from the discharge hole of the nozzle gas discharge mechanism; and (B) after (A), adjusting a film thickness of the film formed on the substrate by, in the process chamber, rotating the substrate, moving one of the substrate or the nozzle gas discharge mechanism relative to another of the substrate or the nozzle gas discharge mechanism such that the discharge hole of the nozzle gas discharge mechanism passes over the center of the substrate, and discharging an etching gas toward the substrate from the discharge hole of the nozzle gas discharge mechanism.

BRIEF DESCRIPTION OF THE DRAWINGS

FIG. 3A is a schematic cross-sectional diagram illustrating a front end of a first nozzle gas discharge mechanism;

FIG. 4A is a schematic cross-sectional diagram illustrating a front end of a second nozzle gas discharge mechanism;

DETAILED DESCRIPTION OF THE DISCLOSURE

Figure 1:
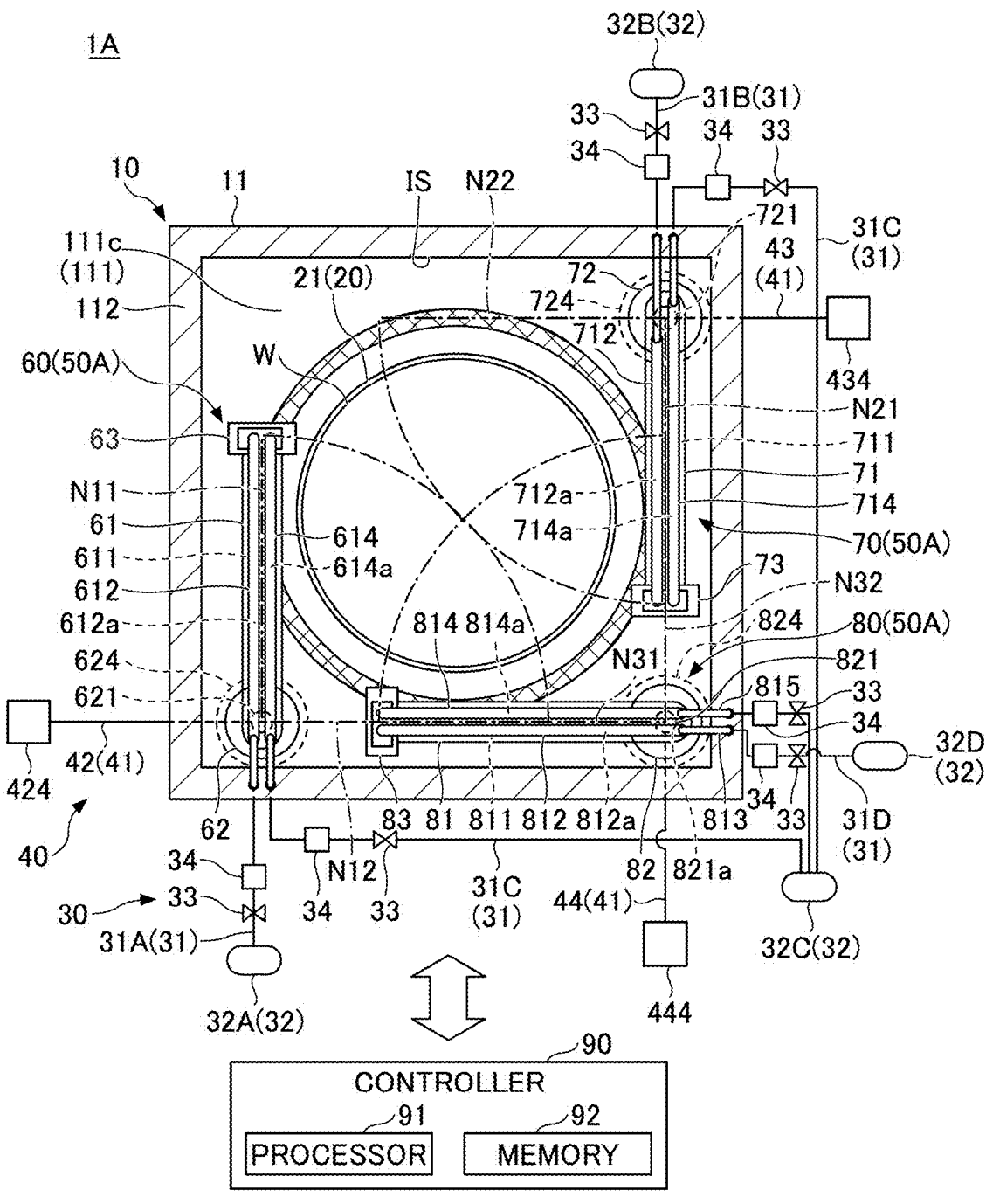
FIG. 1 is a schematic plan diagram illustrating a film-forming apparatus according to an embodiment of the present disclosure.

The present disclosure provides a technique capable of readily forming a film to have a desired film thickness with high accuracy.

Hereinafter, embodiments of the present disclosure will be described with reference to the drawings. In the drawings, the same components may be denoted by the same reference symbols, and duplicate description thereof may be omitted.

Configuration of Film-Forming Apparatus 1

As illustrated in FIG. 1, a film-forming apparatus 1 according to an embodiment of the present disclosure is configured as a single-wafer type film-forming apparatus configured to process substrates W one by one. The film-forming apparatus 1 performs film formation through atomic layer deposition (ALD) or molecular layer deposition (MLD) as substrate processing. Examples of substrate W to be subjected to film formation include semiconductor wafers of a silicon semiconductor, a compound semiconductor, an oxide semiconductor, and the like. The substrate W may have a pattern, such as a trench, a via, or the like.

The film-forming apparatus 1 includes a process chamber 10, a substrate support 20, a gas supply 30, a gas exhauster 40, and a nozzle gas discharge mechanism 50. The film-forming apparatus 1 also includes a controller 90 configured to control movements of individual components of the film-forming apparatus 1.

The process chamber 10 is a rectangular box-shaped chamber having an inner space IS capable of housing the substrate W. The size of the process chamber 10 is preferably set in accordance with the size of the substrate W to be processed. For example, when the diameter of the substrate W is 300 mm, the process chamber 10 is formed with each side having a length of from about 400 mm through about 500 mm. No particular limitation is imposed on the shape of the process chamber 10. The process chamber 10 may be formed in a cylindrical shape (a circular shape in a plan view).

An unillustrated gate valve configured to open and close the inner space IS is provided on lateral sides of the process chamber 10. The film-forming apparatus 1 opens the gate valve before the film formation, and carries the substrate W into the inner space IS from the exterior of the process chamber 10 by a carrier 2 provided in an unillustrated substrate-processing system. After the substrate W is carried, the film-forming apparatus 1 closes the gate valve and performs the film formation. After completion of the film formation, the film-forming apparatus 1 opens the gate valve, and causes the carrier 2 to enter the inner space IS again and carries the substrate W to the exterior of the process chamber 10. The film-forming apparatus 1 as illustrated in FIG. 1 includes multiple (three) gate valves 13 and can carry the substrate W into and out of the process chamber 10 from a desired one of the gate valves 13. However, it is enough that the process chamber 10 is provided with at least one gate valve.

Figure 2:
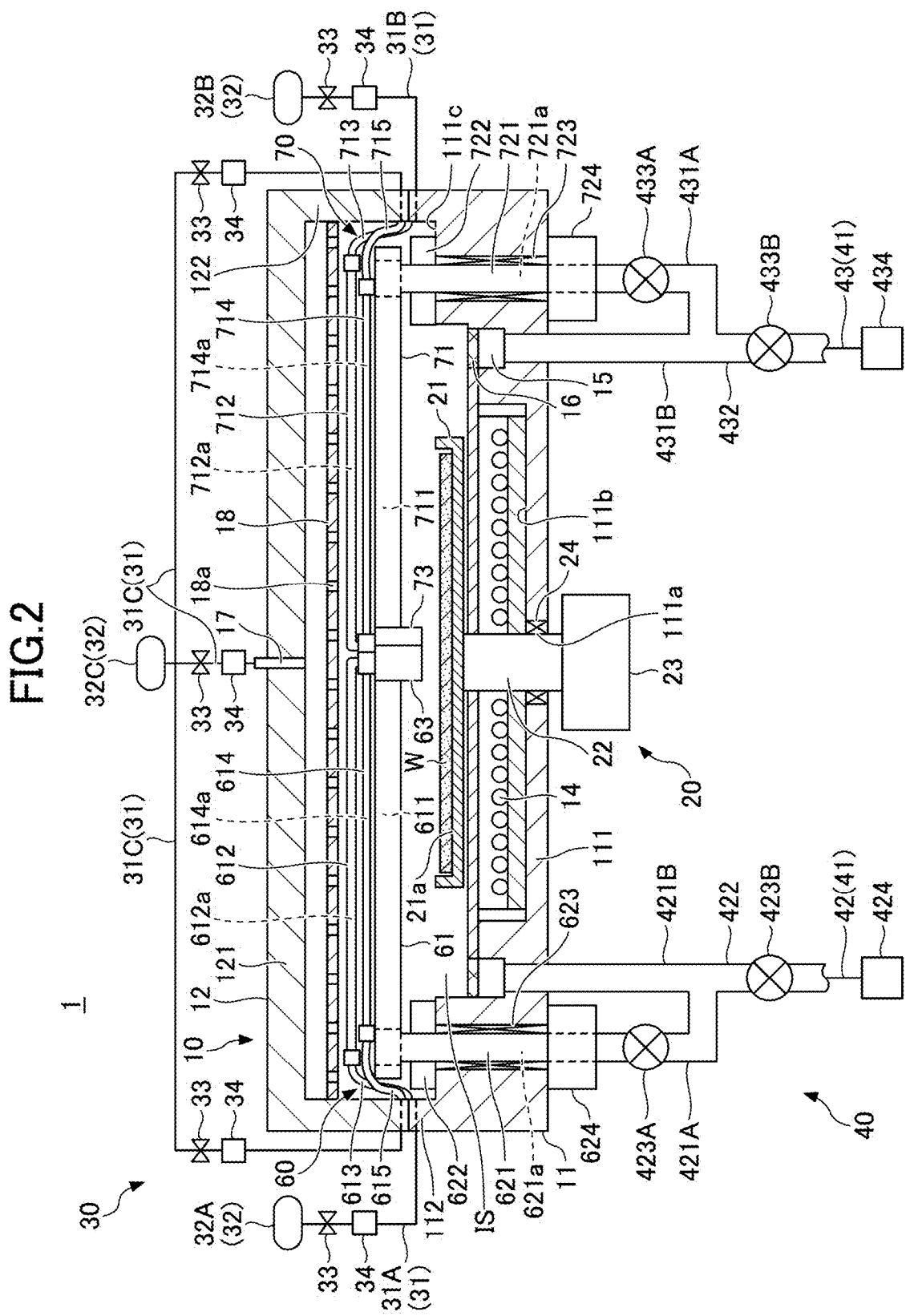
FIG. 2 is a schematic cross-sectional diagram cut along a diagonal line of a process chamber in the film-forming apparatus of FIG. 1.

As illustrated in FIG. 2, the process chamber 10 includes: a lower recessed chamber 11 that is open on the upper side; and an upper recessed chamber 12 that is open on the lower side. The lower recessed chamber 11 is covered by the upper recessed chamber 12. The lower recessed chamber 11 and the upper recessed chamber 12 are fixed so as to close the openings of each other, thereby forming the inner space IS of the process chamber 10. For the sake of convenience, FIG. 1 illustrates the film-forming apparatus 1 with the upper recessed chamber 12 being removed.

The lower recessed chamber 11 includes: a bottom wall 111 that is formed in an approximately square shape in a plan view; and an outer edge projection 112 that is slightly projecting from the four outer edges of the bottom wall 111 upward in the vertical direction. The lower recessed chamber 11 includes the substrate support 20 therein. A through hole 111a through which the below-described shaft 22 of the substrate support 20 passes is formed at a center of the bottom wall 111. A center region including the center of the bottom wall 111 is a depressed portion 111b that is depressed downward with respect to an annular region next to the depressed portion 111b. Also, a peripheral base 111c projecting upward of the annular region is formed outward of the annular region of the bottom wall 111 and between the annular region of the bottom wall 111 and the outer edge projection 112.

A temperature controller 14 configured to control the temperature of the substrate W held by the substrate support 20 is disposed in the depressed portion 111b. No particular limitation is imposed on the temperature controller 14. The temperature controller 14 may have: a configuration including a heater, such as an electric heat wire or the like; a configuration using a flow path that circulates a temperature-controlled medium, which is temperature-controlled by a heat exchanger or the like; or a combined configuration thereof. The temperature controller 14 is connected to the controller 90 via an unillustrated temperature control driver or the like, and the temperature of the substrate W is controlled under the control of the controller 90.

Meanwhile, the upper recessed chamber 12 includes: a ceiling wall 121 that is formed in an approximately square shape (the same shape as the shape of the bottom wall 111) in a plan view; and a side wall 122 that is slightly projecting from the four outer edges of the ceiling wall 121 downward in the vertical direction. The process chamber 10 is fixed such that the lower end of the side wall 122 and the upper end of the outer edge projection 112 face each other. By providing an unillustrated seal member between the lower end of the side wall 122 and the upper end of the outer edge projection 112, the inner space IS is airtightly closed. The gate valve opens and closes, for example, a side opening 122a formed in the side wall 122 (see FIG. 1).

The substrate support 20 provided in the process chamber 10 rotatably holds the substrate W. The substrate support 20 includes: a susceptor 21 configured to directly hold the substrate W; a shaft 22 configured to support the susceptor 21; and a substrate rotator 23 connected to the shaft 22 externally of the process chamber 10.

The susceptor 21 is formed in a regular circular shape that is slightly larger than the substrate W in a plan view. The susceptor 21 includes a stage 21a that extends horizontally in the process chamber 10. An edge is formed around the stage 21a, the edge projecting by the same length as the thickness of the substrate W or by a length greater than the thickness of the substrate W. The substrate support 20 also includes unillustrated multiple lift pin raising and lowering mechanisms configured to receive and deliver the substrate W between the substrate support 20 and the carrier 2. The susceptor 21 may be configured to fix the substrate W by an appropriate holding method (mechanical locking, suctioning, electrostatic chuck, or the like) upon placement of the substrate W on the stage 21a.

The shaft 22 is connected to the lower surface and the center of the susceptor 21, and extends along the axial direction (vertical direction) of the process chamber 10. The substrate rotator 23 rotates the shaft 22 about the axis of the shaft 22, thereby rotating the susceptor 21. A magnetic fluid sealing 24 configured to rotatably seal the shaft 22 is provided between the outer peripheral surface of the shaft 22 and the through hole 111a of the bottom wall 111 of the process chamber 10.

The substrate rotator 23 includes an unillustrated motor and an unillustrated driving force transmitter that connects the motor and the shaft 22. The motor of the substrate rotator 23 is connected to the controller 90 via an unillustrated driver. When the motor of the substrate rotator 23 receives a power that is adjusted by the driver based on a command of the controller 90, the substrate rotator 23 rotates the shaft 22 at an appropriate rotation speed.

As illustrated in FIGS. 1 and 2, the gas supply 30 includes multiple supply paths 31 that cause gases to flow externally of the process chamber 10. The gases include film-forming gases (adsorbing gas, reactive gas), an etching gas, a purge gas, and the like. The gas supply 30 is configured to supply the gases into the process chamber 10 through the respective supply paths 31. The film-forming gases to be supplied to the process chamber 10 are appropriately selected in accordance with a type of a film to be formed on the substrate W. For example, when a silicon oxide film ($SiO_2$ film) is formed, a silicon-containing gas, such as a silane-based gas or the like, can be used as the adsorbing gas. As the reactive gas, an oxygen-containing gas, such as oxygen ($O_2$) gas, ozone ($O_3$)

gas, or the like, can be used. As the etching gas, a gas mixture between fluorine ($F_2$) gas, nitrogen trifluoride ($NF_3$) gas, chlorine ($Cl_2$) gas, tetrafluoromethane ($CF_4$) gas, trifluoromethane ($CHF_3$), $O_2$ gas, $O_3$ gas, Ar gas, No gas, and the like can be used. As the purge gas, an inert gas, such as nitrogen ($N_2$) gas, argon (Ar) gas, or the like, can be used.

The supply paths 31 include an adsorbing gas supply path 31A through which the adsorbing gas flows, a reactive gas supply path 31B through which the reactive gas flows, a purge gas supply path 31C through which the purge gas flows, and an etching gas supply path 31D through which the etching gas flows. The supply paths 31 include: multiple tanks 32 configured to store gases; multiple opening/closing valves 33 configured to open/close the supply paths 31; and multiple flow rate regulators 34 configured to regulate the flow rates of the gases that are flowing through the flow paths of the supply paths 31.

The tanks 32 include an adsorbing gas tank 32A configured to store the adsorbing gas, a reactive gas tank 32B configured to store the reactive gas, a purge gas tank 32C configured to store the purge gas, and an etching gas tank 32D configured to store the etching gas. Also, each of the opening/closing valves 33 and each of the flow rate regulators 34 are connected to the controller 90 via an appropriate driver. The controller 90 opens the opening/closing valves 33 of the supply paths 31 for predetermined gases at appropriate timings, and regulates the flow rates of the gases by the flow rate regulators 34, thereby supplying the predetermined gases to the process chamber 10.

Meanwhile, the gas exhauster 40 includes multiple exhaust paths 41 that cause gases to flow externally of the process chamber 10, the gases including reacted gas, unreacted gas, purge gas, and the like. Through the respective exhaust paths 41, the gases supplied into the process chamber 10 are exhausted. The exhaust paths 41 are divided into three lines in accordance with the below-described three discharge mechanisms of the nozzle gas discharge mechanism 50, i.e., a first nozzle gas discharge mechanism 60, a second nozzle gas discharge mechanism 70, and a third nozzle gas discharge mechanism 80.

A first exhaust path 42 is connected to the first nozzle gas discharge mechanism 60 and a position in the vicinity thereof. The first exhaust path 42 mainly exhausts the gas discharged from the first nozzle gas discharge mechanism 60. The first exhaust path 42 includes: two or more (2) branched exhaust paths 421; and a merged exhaust path 422 in which the branched exhaust paths 421 are merged and through which the gases are collectively exhausted. One of the branched exhaust paths 421A is directly connected to the first nozzle gas discharge mechanism 60, and exhausts the gas of the first nozzle gas discharge mechanism 60. The branched exhaust path 421A is provided with a pressure adjusting valve 423A configured to adjust the pressure of the gas suctioned in the first nozzle gas discharge mechanism 60.

The other branched exhaust path 421B is connected to the annular region of the bottom wall 111 of the process chamber 10, and exhausts the gas of the inner space IS around the susceptor 21. The bottom wall 111 is provided with an exhaust groove 15 that annularly runs laterally of the temperature controller 14 (see FIG. 1). The branched exhaust path 421B is in communication with the bottom of the exhaust groove 15. In order to uniform a conductance upon exhaustion of the gas in the circumferential direction, an exhaust net 16 is preferably provided at the upper opening of the exhaust groove 15.

In order to suction the gas of the entire first exhaust path 42, a suction mechanism 424 (e.g., a turbomolecular pump, a vacuum pump, or the like) is connected to one end of the merged exhaust path 422. Further, the merged exhaust path 422 is provided with a pressure adjusting valve 423B configured to adjust the pressure of the gas suctioned in the entire first line.

A second exhaust path 43 is connected to the second nozzle gas discharge mechanism 70 and a position in the vicinity thereof. The second exhaust path 43 mainly exhausts the gas discharged from the second nozzle gas discharge mechanism 70. Similar to the first exhaust path 42, the second exhaust path 43 includes: two or more (2) branched exhaust paths 431; and a merged exhaust path 432 in which the branched exhaust paths 431 are merged and through which the gases are collectively exhausted. One of the branched exhaust paths 431A is directly connected to the second nozzle gas discharge mechanism 70, and exhausts the gas of the second nozzle gas discharge mechanism 70. The branched exhaust path 431A is provided partway with a pressure adjusting valve 433A configured to adjust the pressure of the gas suctioned in the second nozzle gas discharge mechanism 70. The other branched exhaust path 431B is connected to the annular region (the bottom of the exhaust groove 15) of the bottom wall 111 of the process chamber 10, and exhausts the gas of the inner space IS around the susceptor 21.

In order to suction the gas of the entire second exhaust path 43, a suction mechanism 434 (e.g., a turbomolecular pump, a vacuum pump, or the like) is connected to one end of the merged exhaust path 432. Further, the merged exhaust path 432 is provided partway with a pressure adjusting valve 433B configured to adjust the pressure of the gas suctioned in the entire second line.

A third exhaust path 44 is connected to the third nozzle gas discharge mechanism 80 and a position in the vicinity thereof. The third exhaust path 44 mainly exhausts the gas discharged from the third nozzle gas discharge mechanism 80. Although not illustrated, similar to the first exhaust path 42 and the second exhaust path 43, the third exhaust path 44 may include: two or more (2) branched paths; and a merged path. One of the branched paths is connected to the third nozzle gas discharge mechanism 80, and the other path is connected to the bottom wall 111 of the process chamber 10. The branched path is provided, at an appropriate position thereof, with an unillustrated pressure adjusting valve configured to adjust the pressure of the gas. Also, a suction mechanism 444 configured to suction the gas of the third exhaust path 44 is connected to one end of the merged path of the third exhaust path 44.

The nozzle gas discharge mechanism 50 has functions of: discharging a film-forming gas and a purge gas to the front surface (upper surface) of the substrate W held by the susceptor 21 in the process chamber 10; and suctioning the gas above the substrate W. In addition, the nozzle gas discharge mechanism 50 has functions of: discharging an etching gas to the front surface of the substrate W; and suctioning the gas above the substrate W. Therefore, the nozzle gas discharge mechanism 50 includes the first nozzle gas discharge mechanism 60, the second nozzle gas discharge mechanism 70, and the third nozzle gas discharge mechanism 80 in accordance with the adsorbing gas, the reactive gas, and the etching gas supplied to the substrate W. The film-forming apparatus 1 swings the first nozzle gas discharge mechanism 60, the second nozzle gas discharge mechanism 70, and the third nozzle gas discharge mechanism 80 relative to the substrate support 20 in the process chamber 10. Thereby, a first processing point region PR1 (see FIG. 3A), where gases are discharged and suctioned in the first nozzle gas discharge mechanism 60, a second processing point region PR2 (see FIG. 4A), where gases are discharged and suctioned in the second nozzle gas discharge mechanism 70, and a third processing point region PR3 (see FIG. 5A), where gases are discharged and suctioned in the third nozzle gas discharge mechanism 80, are moved independently of each other.

The first nozzle gas discharge mechanism 60 is disposed at one corner (the lower-left corner in FIG. 1) of the four corners of the process chamber 10 (the lower recessed chamber 11). The first nozzle gas discharge mechanism 60 discharges the adsorbing gas and the purge gas and suctions the discharged gases. Specifically, the first nozzle gas discharge mechanism 60 includes: a first nozzle 61; a first nozzle driver 62 provided at the base end of the first nozzle 61; and a first head 63 provided at the projecting end (front end) of the first nozzle 61.

The first nozzle 61 is disposed at the peripheral base 111*c* of the bottom wall 111, and extends in parallel (horizontally) to the stage 21*a* of the susceptor 21 at a position that is higher than the substrate W placed on the susceptor 21. The first nozzle 61 is formed in a length that can extend from the first nozzle driver 62 in the process chamber 10 to the center of the process chamber 10. The center of the process chamber 10 coincides with the center of the susceptor 21 (substrate W) and the first nozzle 61 extends to the center of the susceptor 21. That is, the extended length of the first nozzle 61 is set to be slightly shorter than half the diagonal line of the process chamber 10, and is set to be longer than the radius of the susceptor 21.

The first nozzle 61 is formed, for example, in a rectangular cylinder in a cross-sectional view, and has a flow path 611 therein through which the gas can flow. Also, multiple tubes 612 and 614 are provided at appropriate positions (e.g., the upper surface) on the outer peripheral surface of the first nozzle 61 in the process chamber 10. The tubes 612 and 614 extend from the base of the first nozzle 61 to the first head 63 of the first nozzle 61 in parallel to the extending direction of the first nozzle 61.

The tube 612 has a flow path 612*a* therein extending along the axial direction thereof. The base end of the tube 612 is connected to a connection tube 613 provided in the process chamber 10. The connection tube 613 has appropriate flexibility such that the tube 612 can move in conformity to the rotation of the first nozzle 61. The connection tube 613 is connected to the adsorbing gas supply path 31A externally of the process chamber 10 via a connector provided in the process chamber 10. Thus, the tube 612 can deliver the adsorbing gas from the base end to the first head 63 along the flow path 612*a*.

The tube 614 has a flow path 614*a* extending along the axial direction thereof. The base end of the tube 614 is connected to a connection tube 615 provided in the process chamber 10. The connection tube 615 has appropriate flexibility such that the tube 614 can move in conformity to the rotation of the first nozzle 61. The connection tube 615 is connected to the purge gas supply path 31C externally of the process chamber 10 via a connector provided in the process chamber 10. Thus, the tube 614 can deliver the purge gas from the base end to the first head 63 along the flow path 614*a*.

The flow path 611 of the first nozzle 61 has a cross-sectional flow path area that is larger than that of the flow path 612*a* of the tube 612 and that of the flow path 614*a* of the tube 614. The flow path 611 delivers the gas suctioned at the outer periphery of the first head 63, and exhausts the gas to the branched exhaust path 421A via a support shaft 621. The base end of the first nozzle 61 is connected to the support shaft 621 of the first nozzle driver 62. In accordance with the movement of the support shaft 621, the first nozzle 61 and the first head 63 are caused to swing (to repeatedly move) in the form of an arc, with the support shaft 621 being a swing axis.

The first nozzle driver 62 rotates the support shaft 621 while ensuring the flow of the gas through the flow path 611 of the first nozzle 61. To do this, the first nozzle driver 62 includes a cover 622, a magnetic fluid sealing 623, and a drive body 624, in addition to the support shaft 621.

The support shaft 621 extends in the vertical direction and is formed into a circular hard tube having a flow path 621*a* therein. The upper end of the support shaft 621 firmly fixes the first nozzle 61, extending in the horizontal direction, using an appropriate fixing member. The lower end of the support shaft 621 is connected to the branched exhaust path 421A externally of the process chamber 10 via an unillustrated connector provided in the process chamber 10. Thereby, the first nozzle 61 can suction the gases from the branched exhaust path 421A, the flow path 621*a*, and the flow path 611 in this order by applying a suction force (negative pressure) to the first head 63 provided at the front end of the first nozzle 61.

The magnetic fluid sealing 623 airtightly seals the space between the bottom wall 111 and the support shaft 621, thereby preventing leakage of the gas from the interior of the process chamber 10 through the first nozzle driver 62. The drive body 624 includes an unillustrated rotary motor and an unillustrated driving force transmitter, and is configured to rotate the support shaft 621 over a set angle range in response to rotary driving of the rotary motor. As the support shaft 621 rotates, the first nozzle 61 swings, with the base end connected to the support shaft 621 being a swing axis. The drive body 624 is connected to the controller 90 via an unillustrated driver, and the rotation speed, rotation direction, and the like, of the rotary motor are controlled under the control of the controller 90.

The first nozzle driver 62 is controlled to repeat clockwise rotation as illustrated in FIG. 1 and counterclockwise rotation as illustrated in FIG. 1 over an approximately 90-degree range. By the driving of the first nozzle driver 62, the first nozzle 61 swings between: one first nozzle movement end N11 set near one side of the process chamber 10; and the other first nozzle movement end N12 set near the other side continuous with and orthogonal to the one side of the process chamber 10. The one first nozzle movement end N11 and the other first nozzle movement end N12 are at positions having an appropriate gap from the susceptor 21 in the horizontal direction (i.e., at positions not overlapping with the susceptor 21 in the vertical direction).

Figure 3A:
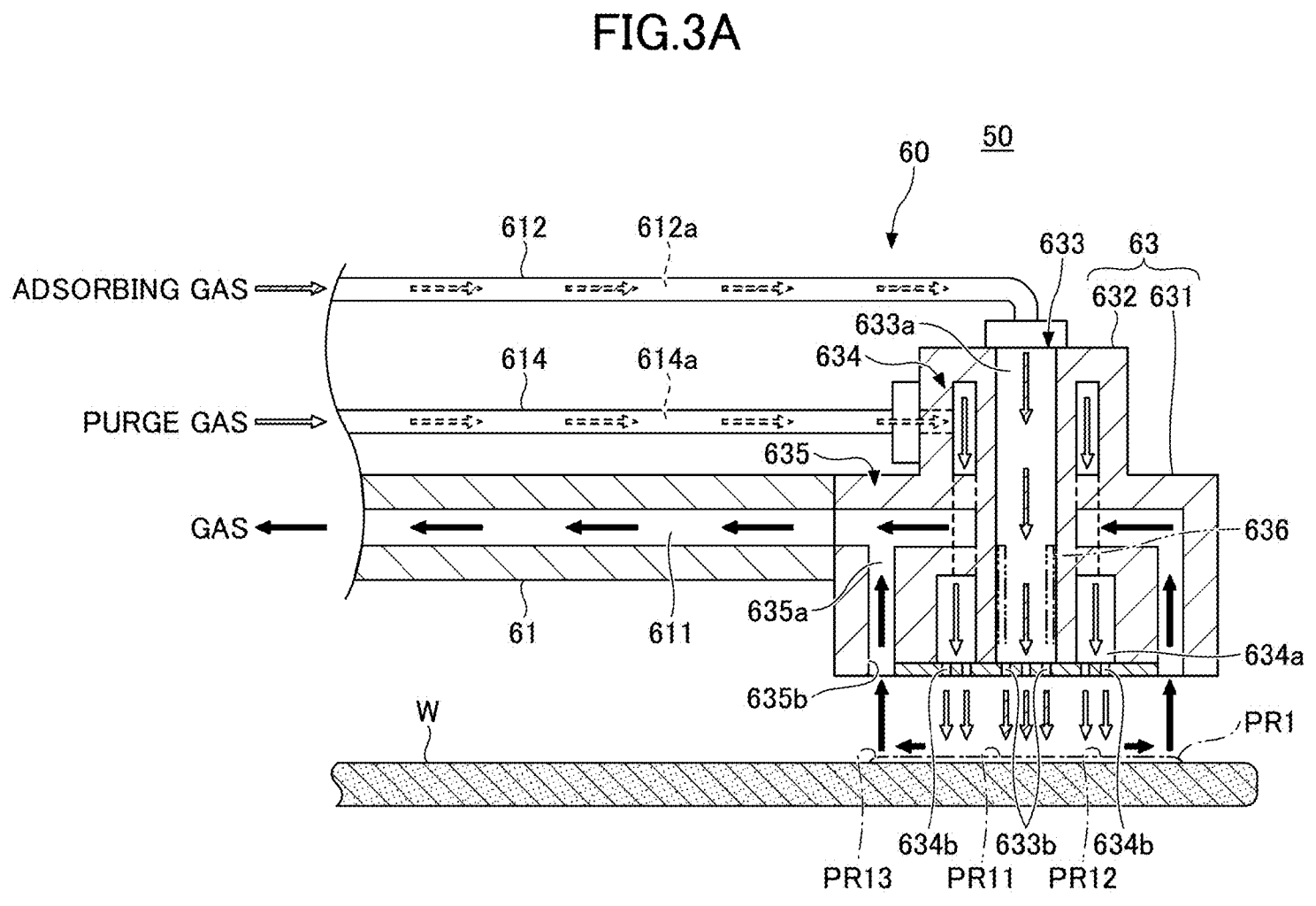
Figure 3B:
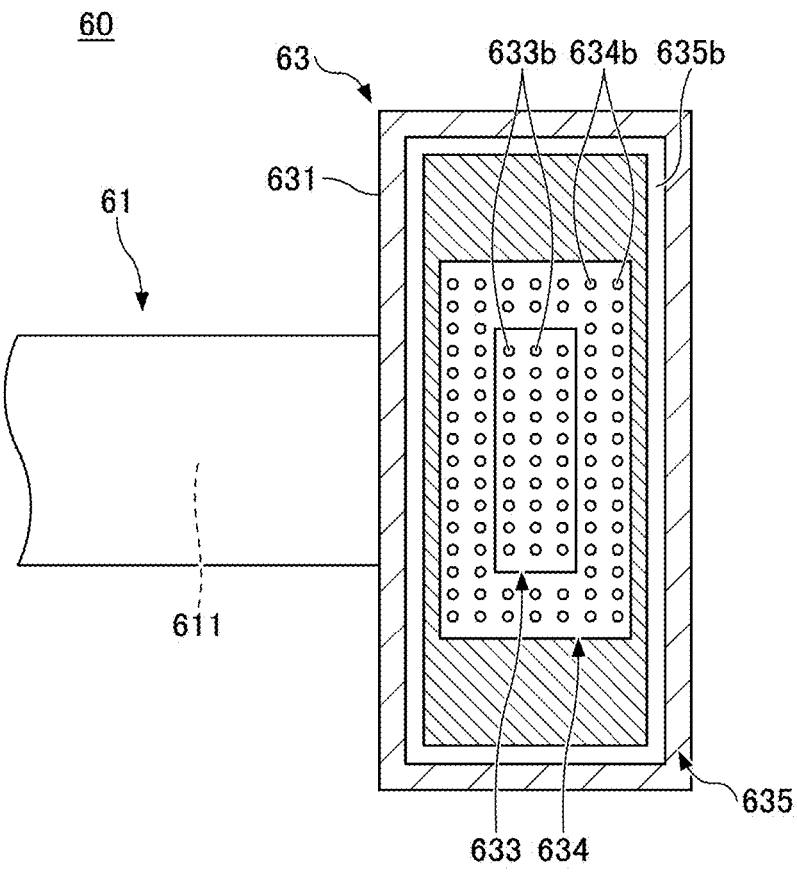
FIG. 3B is a schematic plan diagram illustrating a discharger of a first head.

As illustrated in FIGS. 3A and 3B, the first head 63 provided at the front end of the first nozzle 61 is formed, in a plan view, in a rectangular shape that is longer in a direction orthogonal to the extending direction of the first nozzle 61. The first head 63 forms the first processing point region PR1, where during the film formation, the adsorbing gas is discharged to the substrate W, the purge gas is discharged to the substrate W around the adsorbing gas, and the gas is suctioned externally of the dischargers for the adsorbing gas and the purge gas. The first head 63 is caused to repeatedly move along a first arc path in accordance with swing of the first nozzle 61 between the one first nozzle movement end N11 and the other first nozzle movement end N12. During this movement, the first head 63 faces the substrate W (see FIG. 1).

Specifically, the first head 63 includes: a rectangular head body 631 that is longer in the tangential direction of the first arc path; and a projection 632 projecting from the front surface of the head body 631. The first nozzle 61 is directly connected to the head body 631, and the tube 612 and the tube 614 as described above are connected to the projection 632. The first head 63 includes a processing gas discharger 633, configured to discharge the adsorbing gas, at the center of the head body 631 and at the center of the projection 632.

The processing gas discharger 633 is enclosed by: an inner wall extending over the head body 631 and the projection 632; and a bottom wall (discharge plate 637) facing the substrate W of the head body 631. The processing gas discharger 633 has a discharge path 633a therein, and has multiple discharge holes 633b that are in communication with the discharge path 633a at the bottom wall. The tube 612 is connected to the projection 632 such that the discharge path 633a and the flow path 612a communicate with each other. The processing gas discharger 633 may include, in the discharge path 633a, a heater 636 configured to heat the adsorbing gas supplied from the flow path 612a.

The discharge holes 633b of the processing gas discharger 633 are arranged in a matrix and, as a whole, form a rectangular shape that is longer in the tangential direction of the first arc path. Thereby, the processing gas discharger 633 forms a rectangular adsorbing gas discharge region PR11 at the center of the first processing point region PR1. That is, during the film formation, the processing gas discharger 633 can apply the adsorbing gas to a sufficiently small range of the area of the entire substrate W.

Further, the first head 63 includes a purge gas discharger 634, configured to discharge the purge gas, around the processing gas discharger 633. The purge gas discharger 634 is enclosed: between an inner wall and an outer wall of the projection 632; between an inner wall and a partition wall of the head body 631; and by the bottom wall. The purge gas discharger 634 has a discharge path 634a therein, and has multiple discharge holes 634b that are in communication with the discharge path 634a at the bottom wall. The tube 614 is connected to the projection 632 such that the discharge path 634a and the flow path 614a communicate with each other.

Similar to the discharge holes 633b, the discharge holes 634b of the purge gas discharger 634 are arranged in a matrix, and form a rectangularly annular shape around the discharge holes 633b of the processing gas discharger 633. Thereby, the purge gas discharger 634 forms a rectangularly annular purge gas discharge region PR12 externally of the adsorbing gas discharge region. The purge gas discharger 634 prevents the discharge of the purge gas from spreading outward the adsorbing gas discharged by the processing gas discharger 633 during the film formation.

The first head 63 includes a gas suction section 635, configured to suction the gas, around the purge gas discharger 634. The gas suction section 635 is enclosed by the partition wall and an outer wall of the head body 631. The gas suction section 635 has a suction path 635a therein, and has a continuous opening 635b that is in communication with the suction path 635a. The first nozzle 61 and the head body 631 are connected such that the suction path 635a and the flow path 611 communicate with each other.

The opening 635b is formed in a rectangularly annular shape around the outer periphery of the bottom wall of the head body 631. Thereby, the gas suction section 635 forms a rectangularly annular suction region PR13 externally of the purge gas discharge region. The gas suction section 635 can smoothly suction the adsorbing gas and the purge gas, discharged onto the substrate W, around the discharge region PR12 during the film formation.

As illustrated in FIGS. 1 and 2, the second nozzle gas discharge mechanism 70 is disposed at another corner (the upper-right corner in FIG. 1) located at a position diagonal to the first nozzle gas discharge mechanism 60 of the four corners of the process chamber 10. The second nozzle gas discharge mechanism 70 discharges the reactive gas and the purge gas and suctions the discharged gases. Specifically, the second nozzle gas discharge mechanism 70 includes: a second nozzle 71; a second nozzle driver 72 provided at the base end of the second nozzle 71; and a second head 73 provided at the projecting end (front end) of the second nozzle 71.

The second nozzle 71 is basically formed in the same shape as that of the first nozzle 61. That is, a flow path 711 is provided in the second nozzle 71. Also, multiple tubes 712 and 714 are provided at appropriate positions (e.g., the front surface) on the outer peripheral surface of the second nozzle 71. The tube 712 has a flow path 712a therein, and the base end thereof is connected to a connection tube 713 provided in the process chamber 10. The connection tube 713 is connected to the reactive gas supply path 31B provided externally of the process chamber 10. The tube 714 has a flow path 714a therein, and the base end thereof is connected to a connection tube 715 provided in the process chamber 10. The connection tube 715 is connected to the purge gas supply path 31C provided externally of the process chamber 10.

The second nozzle driver 72 is also formed in the same manner as the first nozzle driver 62. That is, the second nozzle driver 72 includes: a support shaft 721, a cover 722, a magnetic fluid sealing 723, and a drive body 724. The support shaft 721 is formed into a circular hard tube having a flow path 721a therein. The upper end of the support shaft 721 supports the second nozzle 71, and the lower end of the support shaft 721 is connected to a branched exhaust path 431A provided externally of the process chamber 10. Also, the drive body 724 includes an unillustrated rotary motor and an unillustrated driving force transmitter, and is configured to rotate the support shaft 721 over a set angle range in response to rotary driving of the rotary motor. The drive body 724 is connected to the controller 90 via an unillustrated driver, and the rotation speed, rotation direction, and the like, of the rotary motor are controlled under the control of the controller 90.

The second nozzle driver 72 is controlled to repeat clockwise rotation and counterclockwise rotation about the support shaft 721 over an approximately 90-degree range. By the driving of the second nozzle driver 72, the second nozzle 71 swings between: one second nozzle movement end N21 set near one side of the process chamber 10; and the other second nozzle movement end N22 set near the other side continuous with and orthogonal to the one side of the process chamber 10. The one second nozzle movement end N21 and the other second nozzle movement end N22 are at positions having an appropriate gap from the susceptor 21 in the horizontal direction (i.e., at positions not overlapping with the susceptor 21 in the vertical direction).

Figure 4A:
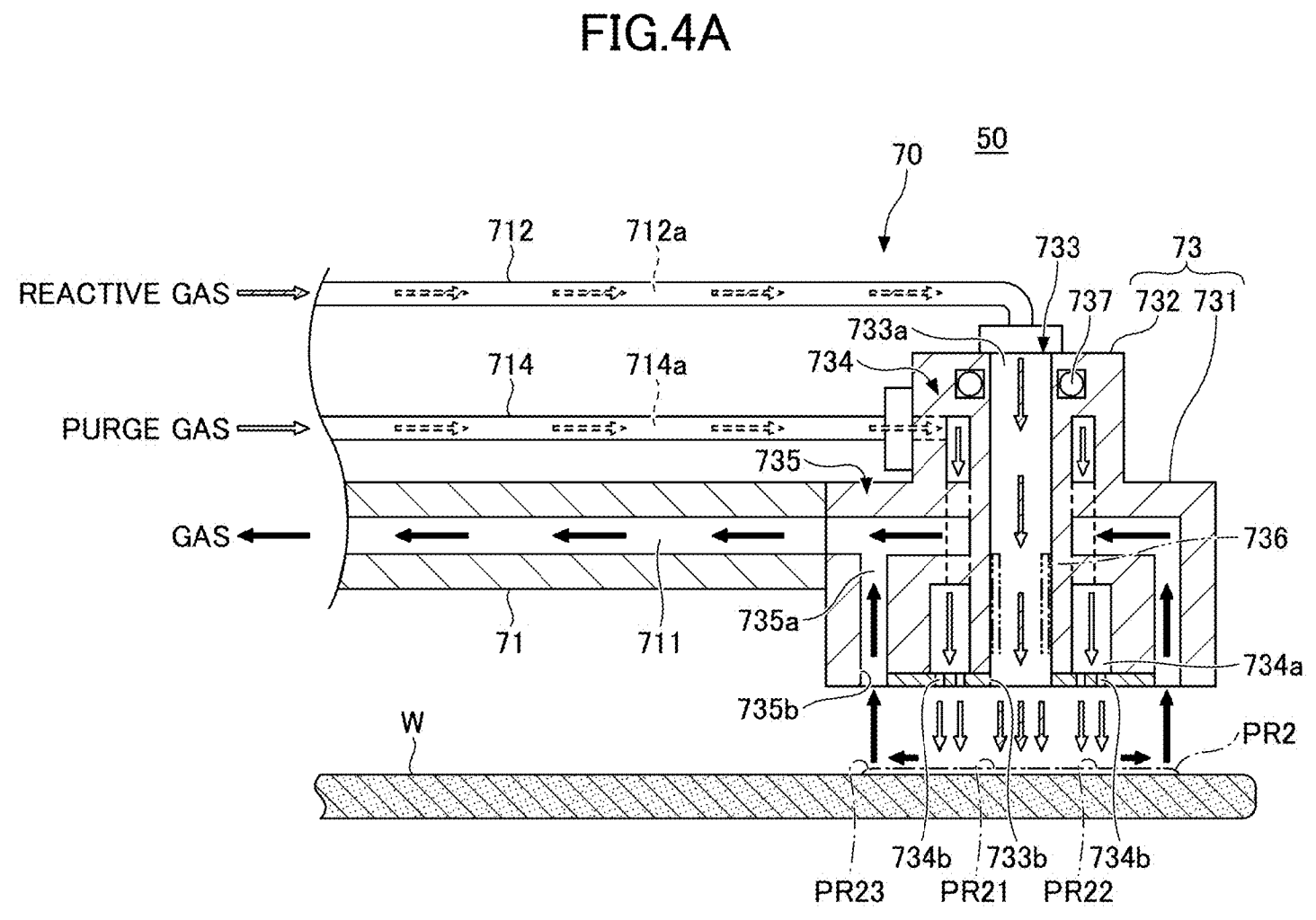
Figure 4B:
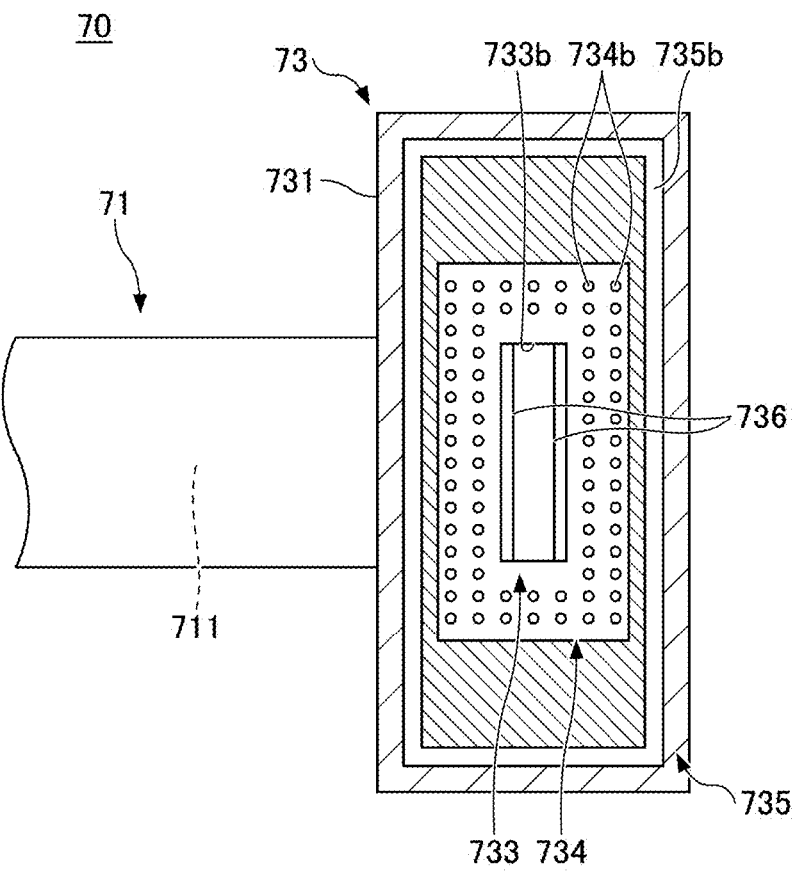
FIG. 4B is a schematic plan diagram illustrating a discharger of a second head.

As illustrated in FIGS. 4A and 4B, the second head 73 is basically formed in the same manner as the first head 63. The second head 73 forms a second processing point region PR2, where during the film formation, the reactive gas is discharged to the substrate W, the purge gas is discharged to the substrate W around the reactive gas, and the gas is suctioned externally of the dischargers for the reactive gas and the purge gas. The second head 73 is caused to repeatedly move along a second arc path in accordance with swing of the second nozzle 71 between the one second nozzle movement end N21 and the other second nozzle movement end N22. During this movement, the second head 73 faces the substrate W.

Specifically, the second head 73 includes: a rectangular head body 731 that is longer in the tangential direction of the second arc path; and a projection 732 projecting from the front surface of the head body 731. The tube 712 and the tube 714 are connected to the projection 732. The second head 73 includes a processing gas discharger 733, configured to discharge the reactive gas, at the center of the head body 731 and at the center of the projection 732.

The processing gas discharger 733 is enclosed by: an inner wall extending over the head body 731 and the projection 732; and a bottom wall (discharge plate) facing the substrate W of the head body 731. The processing gas discharger 733 has a discharge path 733*a* therein, and has a discharge hole 733*b* that is in communication with the discharge path 733*a*. The tube 712 is connected to the projection 732 such that the discharge path 733*a* and the flow path 712*a* communicate with each other. In this embodiment, the discharge hole 733*b* has a rectangular shape that is continuous in the longitudinal direction thereof. However, this is by no means a limitation. The second head 73 may have multiple discharge holes similar to the first head 63. The processing gas discharger 733 may include, in the discharge path 733*a*, a heater 736 configured to heat the reactive gas supplied from the flow path 712*a*.

In addition, the processing gas discharger 733 may discharge the reactive gas as is (or after heating) in accordance with requests for the film formation. The processing gas discharger 733 may be configured to discharge the reactive gas after being formed into a plasma. In the following, a specific description will be given of a configuration in which the processing gas discharger 733 discharges the reactive gas after being formed into a plasma. The processing gas discharger 733 includes a plasma antenna 737 around the outer peripheral surface of the inner wall of the projection 732. The antenna 737 is connected to an unillustrated high-frequency power supply provided externally of the process chamber 10 via an unillustrated interconnect. For example, the interconnect extends along the outer peripheral surface of the second nozzle 71. Therefore, during the film formation, a high-frequency power is supplied from the high-frequency power supply to the antenna 737 via the interconnect, thereby generating a plasma in the reactive gas flowing through the discharge path 733*a*.

When the reactive gas is formed into a plasma, the reactive gas for use may be, for example, a gas mixture obtained by appropriately mixing $O_2$, $H_2$, $NH_3$, Ar, $N_2$, and the like. In addition, in order to form a high-quality oxide film, an $O_3$-containing purge gas may be supplied as the purge gas in the generation of the plasma. Thereby, upon discharge of the reactive gas, the processing gas discharger 733 can form a reactive (plasma) gas discharge region PR21 at the center of the second processing point region PR2.

Further, the second head 73 includes a purge gas discharger 734, configured to discharge the purge gas, around the processing gas discharger 733. The purge gas discharger 734 can have the same configuration as that of the purge gas discharger 634 of the first head 63. That is, the purge gas discharger 734 has a discharge path 734*a* and multiple discharge holes 734*b*, and forms a purge gas discharge region PR22. The second head 73 has a gas suction section 735, configured to suction the gas, around the purge gas discharger 734. The gas suction section 735 can have the same configuration as that of the gas suction section 635 of the first head 63. That is, the gas suction section 735 has a suction path 735*a* and an opening 735*b*, and forms a gas suction region PR23.

As illustrated in FIG. 1, the third nozzle gas discharge mechanism 80 is disposed at a corner (the lower-right corner in FIG. 1) different from those of the first nozzle gas discharge mechanism 60 and the second nozzle gas discharge mechanism 70, of the four corners of the process chamber 10. The third nozzle gas discharge mechanism 80 discharges the etching gas and the purge gas and suctions the discharged gases. Specifically, the third nozzle gas discharge mechanism 80 includes: a third nozzle 81; a third nozzle driver 82 provided at the base end of the third nozzle 81; and a third head 83 provided at the projecting end (front end) of the third nozzle 81.

The third nozzle 81 is basically formed in the same shape as that of the first nozzle 61. That is, a flow path 811 is provided in the third nozzle 81. Also, multiple tubes 812 and 814 are provided at appropriate positions (e.g., the upper surface) on the outer peripheral surface of the third nozzle 81. The tube 812 has a flow path 812*a* therein, and the base end thereof is connected to a connection tube 813 provided in the process chamber 10. The connection tube 813 is connected to an etching gas supply path 31D provided externally of the process chamber 10. Thereby, the gas supply 30 supplies the etching gas from the etching gas tank 32D through the etching gas supply path 31D externally of the process chamber 10. The tube 814 has a flow path 814*a* therein, and the base end thereof is connected to a connection tube 815 provided in the process chamber 10. The connection tube 815 is connected to the purge gas supply path 31C provided externally of the process chamber 10.

The third nozzle driver 82 is also formed in the same manner as the first nozzle driver 62. That is, the third nozzle driver 82 includes: a support shaft 821, an unillustrated cover, an unillustrated magnetic fluid sealing, and a drive body 824. The support shaft 821 is formed into a circular hard tube having a flow path 821*a* therein. The upper end of the support shaft 821 supports the third nozzle 81, and the lower end of the support shaft 821 is connected to the third exhaust path 44 provided externally of the process chamber 10. Also, the drive body 824 includes an unillustrated rotary motor and an unillustrated driving force transmitter, and is configured to rotate the support shaft 821 over a set angle range in response to rotary driving of the rotary motor. The drive body 824 is connected to the controller 90 via an unillustrated driver, and the rotation speed, rotation direction, and the like, of the rotary motor are controlled under the control of the controller 90.

The third nozzle driver 82 is controlled to repeatedly perform clockwise rotation and counterclockwise rotation of the support shaft 821 over an approximately 90-degree range. By the driving of the third nozzle driver 82, the third nozzle 81 swings between: one third nozzle movement end N31 set near one side of the process chamber 10; and the other third nozzle movement end N32 set near the other side continuous with and orthogonal to the one side of the process chamber 10. The one third nozzle movement end N31 and the other third nozzle movement end N32 are at positions having an appropriate gap from the susceptor 21 in the horizontal direction (i.e., at positions not overlapping with the susceptor 21 in the vertical direction).

Figure 5A:
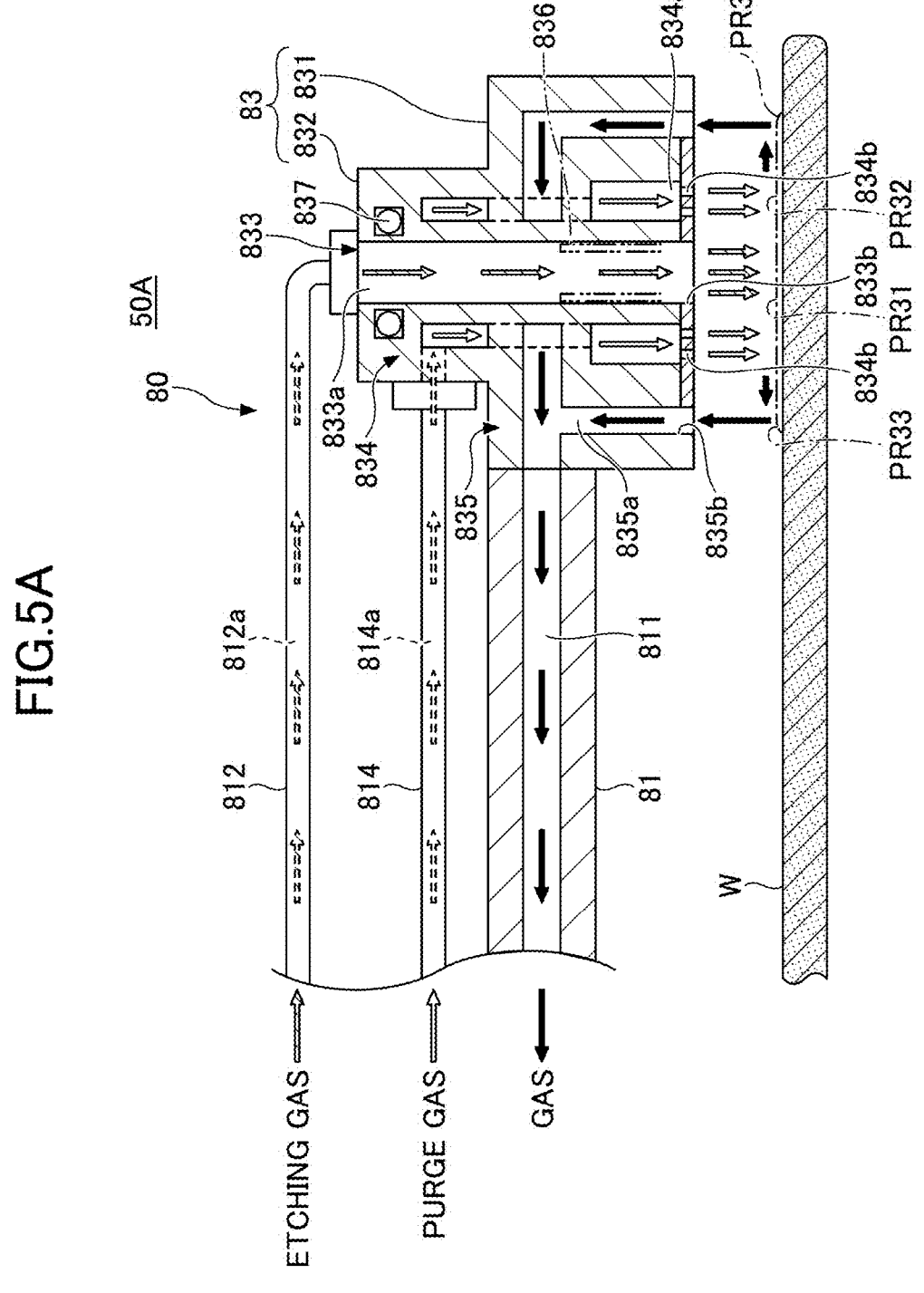
FIG. 5A is a schematic cross-sectional diagram illustrating a front end of a third nozzle gas discharge mechanism.
Figure 5B:
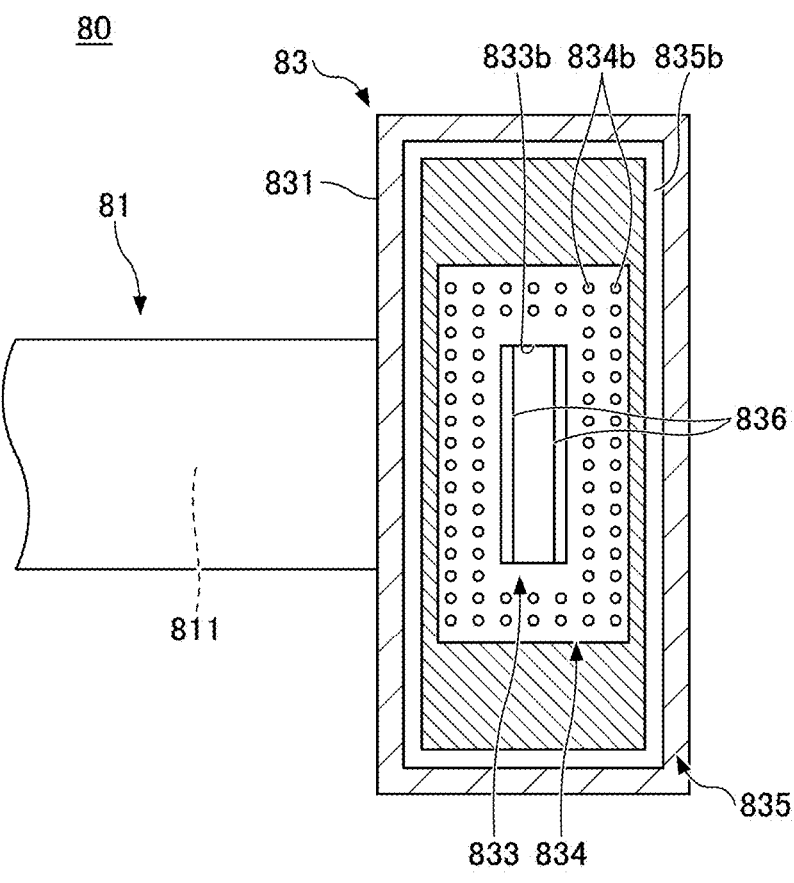
FIG. 5B is a schematic plan diagram illustrating a discharger of a third head.

As illustrated in FIGS. 5A and 5B, the third head 83 is basically formed in the same manner as the second head 73. The third head 83 forms a third processing point region PR3, where during the substrate processing, the etching gas is discharged to the substrate W, the purge gas is discharged to the substrate W around the etching gas, and the gas is suctioned externally of the dischargers for the etching gas and the purge gas. The third head 83 is caused to repeatedly move along a third arc path in accordance with swing of the third nozzle 81 between the one third nozzle movement end N31 and the other third nozzle movement end N32. During this movement, the third head 83 faces the substrate W.

Specifically, the third head 83 includes: a rectangular head body 831 that is longer in the tangential direction of the third arc path; and a projection 832 projecting from the upper surface of the head body 831. The tube 812 and the tube 814 are connected to the projection 832. The third head 83 includes a processing gas discharger 833, configured to discharge the etching gas, at the center of the head body 831 and at the center of the projection 832.

The processing gas discharger 833 is enclosed by: an inner wall extending over the head body 831 and the projection 832; and a bottom wall facing the substrate W of the head body 831. The processing gas discharger 833 has a discharge path 833a therein, and has discharge holes 833b that are in communication with the discharge path 833a. The tube 812 is connected to the projection 832 such that the discharge path 833a and the flow path 812a communicate with each other. The processing gas discharger 833 may include, in the discharge path 833a, a heater 836 configured to heat the reactive gas supplied from the flow path 812a.

The processing gas discharger 833 is configured to discharge the etching gas after being formed into a plasma. The processing gas discharger 833 includes a plasma antenna 837 around the outer peripheral surface of the inner wall of the projection 832. During the substrate processing, a high-frequency power is supplied from a high-frequency power supply to the antenna 837 via an unillustrated interconnect, thereby generating a plasma in the etching gas flowing through the discharge path 833a. The processing gas discharger 833 is not limited to the configuration of forming the etching gas into a plasma. For example, when the etching gas is activated by application of heat, the processing gas discharger 833 may include only a configuration of heating the etching gas (heater 836).

Further, the third head 83 includes a purge gas discharger 834, configured to discharge the purge gas, around the processing gas discharger 833. The purge gas discharger 834 can have the same configuration as that of the purge gas discharger 634 of the first head 63. That is, the purge gas discharger 834 has a discharge path 834a and multiple discharge holes 834b, and forms a purge gas discharge region PR32 around an etching gas discharge region PR31. The third head 83 has a gas suction section 835, configured to suction the gas, around the purge gas discharger 834. The gas suction section 835 can have the same configuration as that of the gas suction section 735 of the first head 63. That is, the gas suction section 835 has a suction path 835a and an opening 835b, and forms a gas suction region PR33 around the purge gas discharge region PR32.

As illustrated in FIG. 2, the film-forming apparatus 1 further includes a mechanism configured to supply the purge gas from the upper part (above the nozzle gas discharge mechanism 50) of the process chamber 10 to the lower inner space IS. For example, the ceiling wall 121 of the upper recessed chamber 12 includes a gas introducing port 17 configured to introduce the purge gas. The gas introducing port 17 is connected to a purge gas tank 32C, storing the purge gas, through the purge gas supply path 31C including the opening/closing valve 33 and the flow rate regulator 34.

A shower head 18 may be provided in the upper recessed chamber 12 in order to horizontally diffuse the purge gas introduced from the gas introducing port 17. The shower head 18 is formed in the form of a flat plate having multiple gas holes 18a. The shower head 18 uniformly discharges the purge gas, supplied to the space between the shower head 18 and the ceiling wall 121, to a space below the shower head 18 (a space including the substrate W and the nozzle gas discharge mechanism 50).

As illustrated in FIG. 1, a computer including a processor 91, a memory 92, an unillustrated input/output interface, and the like can be applied as the controller 90 configured to control the film-forming apparatus 1. The processor 91 is a combination of one or more of a central processing unit (CPU), a graphics processing unit (GPU), an application specific integrated circuit (ASIC), a field-programmable gate array (FPGA), a circuit formed of multiple discrete semiconductors, and the like. The memory 92 includes: a main storage formed of a semiconductor memory; and an auxiliary storage formed of a disk, a semiconductor memory, a flash memory, or the like.

The memory 92 stores: programs for driving the film-forming apparatus 1; and recipes, such as process conditions for the film formation, and the like. The processor 91 reads and executes the program of the memory 92, and controls the components of the film-forming apparatus 1. The controller 90 may be configured by a host computer or multiple client computers that perform information communication via a network.

The controller 90 controls the components of the film-forming apparatus 1, thereby achieving formation of a desired film on the substrate W held by the substrate support 20. At this time, the controller 90 controls the driving of the first nozzle driver 62 and swings the first nozzle 61 in parallel to the surface of the substrate W. Also, the controller 90 controls the driving of the second nozzle driver 72 and swings the second nozzle 71 in parallel to the surface of the substrate W. Further, the controller 90 controls the driving of the third nozzle driver 82 and swings the third nozzle 81 in parallel to the surface of the substrate W. The swing of the third nozzle 81 is performed after completion of the film formation performed by the first nozzle gas discharge mechanism 60 and the second nozzle gas discharge mechanism 70.

During the film formation, the first head 63 repeatedly moves along the first arc path in accordance with the swing of the first nozzle 61. The second head 73 repeatedly moves along the second arc path in accordance with the swing of the second nozzle 71. The first arc path and the second arc path cross each other at the center of the susceptor 21 (of the substrate W). For example, the controller 90 controls the swing speed of the first nozzle 61 and the swing speed of the second nozzle 71 so as to be the same, and controls the start timing of the swing of the first nozzle 61 and the start timing of the swing of the second nozzle 71 so as to be different. Thereby, the film-forming apparatus 1 can avoid interference between the first head 63 and the second head 73, thereby stably repeatedly performing the repeated movement of the first head 63 and the repeated movement of the second head 73.

The controller 90 performs the repeated movement of the first nozzle gas discharge mechanism 60 and the second nozzle gas discharge mechanism 70, and drives the gas supply 30 and the gas exhauster 40, thereby performing supply of the film-forming gas (adsorbing gas, reactive gas) and suction of the gas using the nozzle gas discharge mechanism 50.

The discharge holes 633*b* of the first head 63 move along the first arc path, and form the adsorbing gas discharge region PR11 on the lower side in the vertical direction as illustrated in FIG. 3A, thereby adsorbing the adsorbing gas onto the rotating substrate W. Further, by forming the purge gas discharge region PR12 around the adsorbing gas discharge region PR11, the first head 63 can prevent spread of the adsorbing gas and readily control the adsorbing gas discharge region PR11. Then, by suctioning the gas in the suction region PR13 external of the discharge region PR12, the first head 63 can reduce the adsorbing gas remaining near the upper surface of the substrate W, and can prevent adhesion of the adsorbing gas to a region other than the first processing point region PR1 of the substrate W.

Meanwhile, the discharge hole 733*b* of the second head 73 moves along the second arc path, and forms the reactive gas discharge region PR21 on the lower side in the vertical direction as illustrated in FIG. 4A, thereby discharging the reactive gas, formed into a plasma, onto the rotating substrate W. Further, by forming the purge gas discharge region PR22 around the reactive gas discharge region PR21, the second head 73 can prevent spread of the reactive gas and readily control the reactive gas discharge region PR21. Then, by suctioning the gas in the suction region PR23 external of the discharge region PR22, the second head 73 can reduce the reactive gas remaining near the front surface of the substrate W, and can prevent reaction of the reactive gas in a region other than the second processing point region PR2 of the substrate W.

Figure 6:
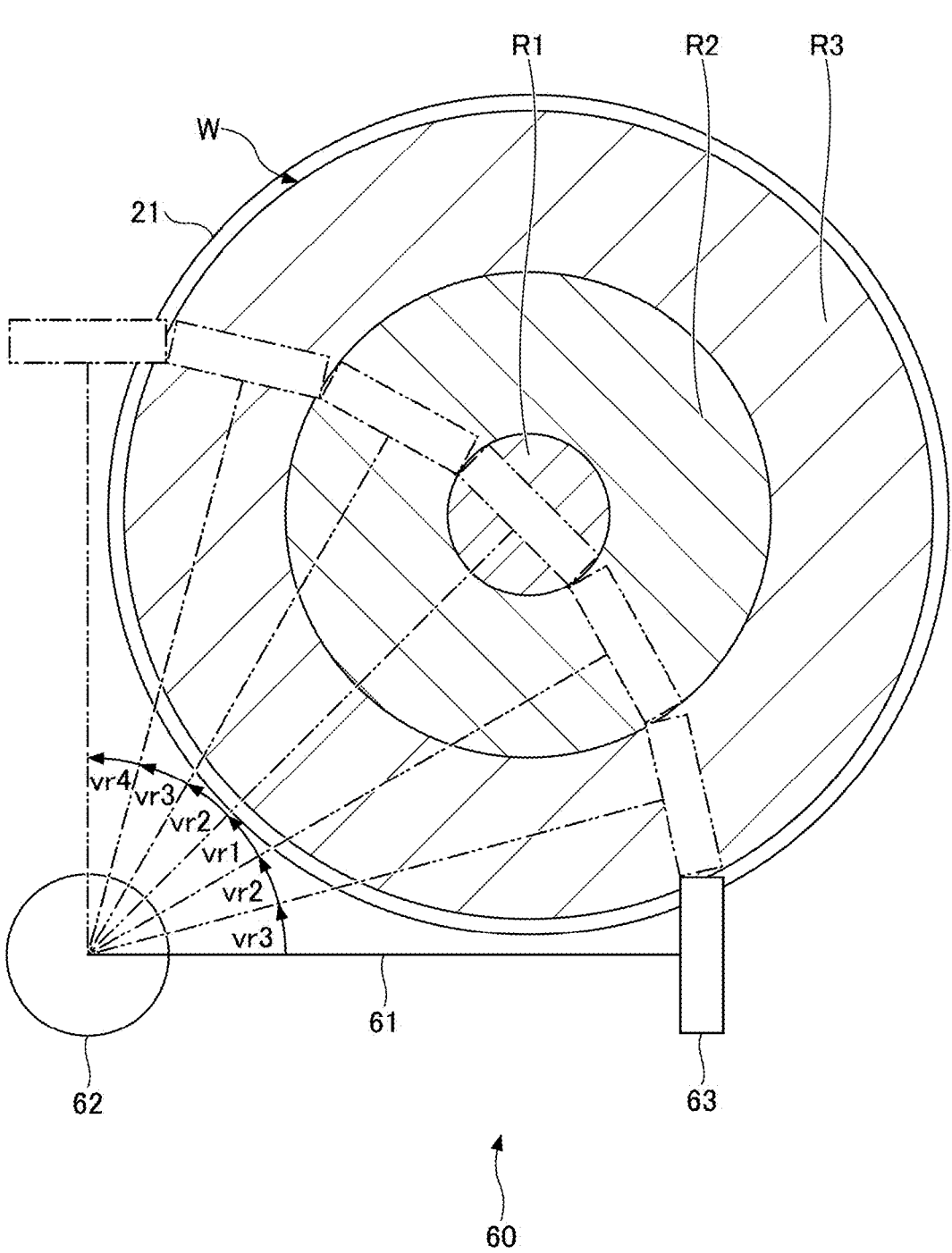
FIG. 6 is a schematic plan diagram describing a swing speed of the first nozzle gas discharge mechanism.

As illustrated in FIG. 6, the film-forming apparatus 1 may perform control of changing the speed of movement of the first nozzle gas discharge mechanism 60 and the speed of movement of the second nozzle gas discharge mechanism 70 (or the speed of movement of the third nozzle gas discharge mechanism 80). In the following, the swing of the first nozzle gas discharge mechanism 60 will be described, and description of the second nozzle gas discharge mechanism 70 and the third nozzle gas discharge mechanism 80 swinging in the same manner will be omitted.

When the surface of the substrate W is divided into multiple sections so as to have equally divided radii from the center of the substrate W in a radial outward direction, the surface areas of the sections are smaller at a center area and are larger on the outer edge side. In FIG. 6, the surface of the substrate W is divided into three sections (hereinafter the divided sections may also be referred to as a first section R1 to a third section R3 in the order from the center to the outer edge of the substrate W). The number of the divided sections is not limited to three, and may be two or may be four or more.

The first section R1 has a regular circular shape at the center of the substrate W. The second section R2 is externally next to the first section R1 and has an annular shape around the first section R1. The third section R3 is externally next to the second section R2 and has an annular shape around the second section R2. In this case, a relation between the surface areas of the sections is as follows: the first section R1<the second section R2<the third section R3. Therefore, the film-forming method can attempt to ensure in-plane uniformity in the film formation by supplying a large amount of the film-forming gas toward the third section R3 of the rotating substrate W and a small amount of the film-forming gas toward the first section R1 of the rotating substrate W.

Specifically, the controller 90 allows the discharge holes 633*b* and 733*b* of the nozzle gas discharge mechanism 50 to face the third section R3 (on the outer edge side) for time longer than the time during which the discharge holes 633*b* and 733*b* face the first section R1 (at the center area), thereby increasing the amount of the film-forming gas supplied to the third section R3. That is, the controller 90 controls the swing of the first nozzle gas discharge mechanism 60, the second nozzle gas discharge mechanism 70, and the third nozzle gas discharge mechanism 80 in accordance with the relation: the swing speed Vr1 in the first section R1>the swing speed Vr2 in the second section R2>the swing speed Vr3 in the third section R3. This can appropriately adjust the film thickness of a film to be formed on the surface of the substrate W.

The surface area of each section of the substrate W is not limited to that calculated only from the area of the substrate W in a plan view. The surface area of each section of the substrate W also varies with a projecting and recessed pattern (e.g., a trench, a via, and the like) of the semiconductor device formed on the surface. Therefore, the film formed on the surface of the substrate W may not have a uniform film thickness due to a loading effect occurring during film formation. For example, the film formed on the substrate W may have a recessed shape in which the film thickness of the formed film is smaller at a center area and is larger on the outer edge side (see the second stage of FIG. 8A). Alternatively, the film formed on the substrate W may have a projecting shape in which the film thickness of the formed film is larger at a center area and is smaller on the outer edge side (see the second stage of FIG. 8B).

In this manner, when a film having a shape different from a target shape (e.g., a flat shape) is formed, the film-forming apparatus 1 additionally performs etching by means of the third nozzle gas discharge mechanism 80 after the film formation by means of the first nozzle gas discharge mechanism 60 and the second nozzle gas discharge mechanism 70. Thereby, the film-forming apparatus 1 can form a film having a target shape by adjusting the film thickness of the film on the substrate W. In the following, the movement of the third nozzle gas discharge mechanism 80 in the etching will be described with reference to FIGS. 7A and 7B and FIGS. 8A and 8B.

Figure 7A:
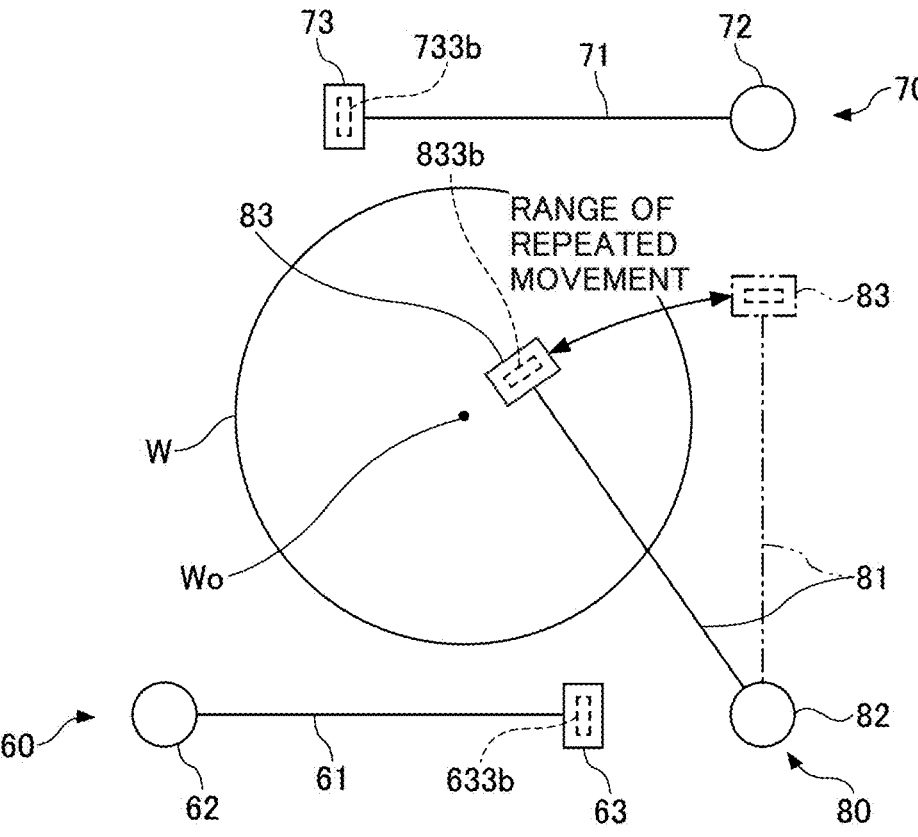
FIG. 7A is a schematic plan diagram illustrating a first movement example of the third nozzle gas discharge mechanism in partial etching.

As illustrated in FIG. 7A, the film-forming apparatus 1 can repeatedly move the third nozzle gas discharge mechanism 80, under the control of the controller 90, within a range of from the outer edge of the substrate W to a position before the third nozzle gas discharge mechanism 80 reaches a center Wo of the substrate W. In other words, the discharge holes 833*b* of the third nozzle gas discharge mechanism 80 repeatedly move, on the outer edge side of the substrate W, in a range that is shorter than the diameter of the substrate W. This range refers to a range in which a straight line connecting a start point of movement of the third head 83 and an end point of movement of the third head 83 is shorter than the diameter of the substrate W. Thereby, the discharge holes 833*b* of the third nozzle gas discharge mechanism 80 continue to face the substrate W within a limited range for a long time. Each of the discharge holes 833*b* supplies a large amount of an etching gas to an area faced thereby for a long time. As a result, the film-forming apparatus 1 can reduce the etching level in a region closer to the center Wo of the substrate W (or achieve no etching) and increase the etching level on the outer edge side of the substrate W. Hereinafter, etching performed by limiting the range of movement of the third nozzle gas discharge mechanism 80 is also referred to as partial etching.

In the partial etching, the discharge condition of the etching gas is set such that the discharge holes 833*b* of the third nozzle gas discharge mechanism 80 face, for a longer time, a region in which the film thickness of the film is larger than that of the target shape. Thereby, a larger amount of the etching gas can be supplied to the region in which the film thickness of the film is larger, and the film in that region can be etched. Meanwhile, when the third nozzle gas discharge mechanism 80 is not caused to face a region in which the film on the substrate W is smaller or when the third nozzle gas discharge mechanism 80 is caused to face that region only for a short time, reduction in the film thickness can be suppressed. Also, even in the case of performing the partial etching, the swing speed of the third nozzle 81 may be changed for each of multiple sections on the substrate W. For example, the speed of the third nozzle 81 is prevented from decreasing at the end of the repeated movement in the region closer to the center Wo of the substrate W, thereby enabling formation of larger films in the other regions.

Preferably, the controller 90 gradually limits the range of the repeated movement of the third nozzle gas discharge mechanism 80 in the partial etching of performing etching the outer edge of the substrate W. For example, the controller 90 shifts the end of the repeated movement of the third nozzle 81 in the region closer to the center Wo of the substrate W toward the outer edge of the substrate W over time during the partial etching. Thereby, the film-forming apparatus 1 can gradually decrease the film thickness toward the outer edge of the substrate W without appreciably changing the thickness of the film in the region closer to the center Wo of the substrate W.

Figure 7B:
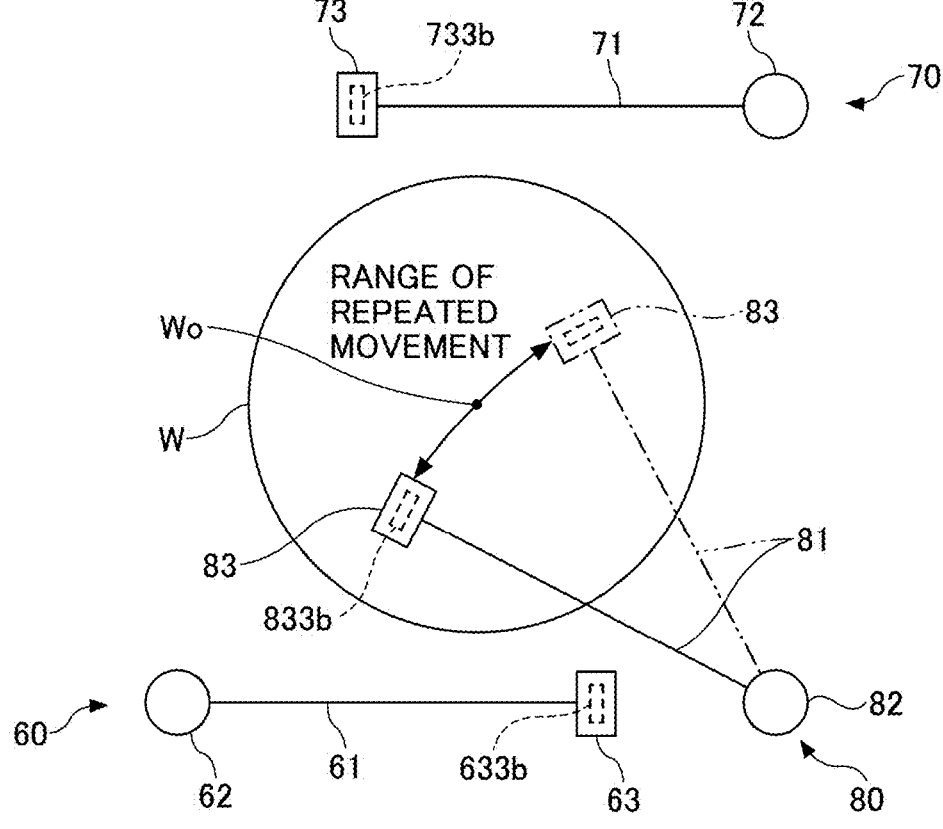
FIG. 7B is a schematic plan diagram illustrating a second movement example of the third nozzle gas discharge mechanism in partial etching.

Alternatively, as illustrated in FIG. 7B, the film-forming apparatus 1 can repeatedly move the third nozzle gas discharge mechanism 80 for the partial etching, under the control of the controller 90, within a range in which the third nozzle gas discharge mechanism 80 passes over the center Wo of the substrate W and does not reach the outer edge of the substrate W. In other words, the discharge holes 833*b* of the third nozzle gas discharge mechanism 80 repeatedly move, near the center Wo of the substrate W, in a range that is shorter than the diameter of the substrate W. The film-forming apparatus 1 can reduce the etching level (or achieve no etching) on the outer edge side of the substrate W and increase the etching level in the region closer to the center Wo of the substrate W.

Preferably, the controller 90 gradually limits the range of the repeated movement of the third nozzle gas discharge mechanism 80 also in the partial etching of performing etching in the region closer to the center Wo of the substrate W. For example, the controller 90 gradually narrows the range of movement of the third nozzle 81 toward the center Wo of the substrate W. Thereby, the film-forming apparatus 1 can gradually decrease the film thickness near the center Wo of the substrate W without appreciably changing the film thickness of the film on the outer edge side of the substrate W.

By performing the above-described partial etching, even if a projecting or recessed film is formed in the first film formation, the film-forming apparatus 1 can adjust such a film to be flat. The first film formation is a process of forming a film on the overall surface of the substrate W by repeatedly moving the first nozzle gas discharge mechanism 60 and the second nozzle gas discharge mechanism 70 from one of the outer edges of the substrate W to the other outer edge of the substrate W (hereinafter also referred to as overall film formation).

Specifically, during the overall film formation, the film-forming apparatus 1 repeatedly moves the first nozzle 61 of the first nozzle gas discharge mechanism 60 between the one first nozzle movement end N11 and the other first nozzle movement end N12 (an approximately 90-degree range of movement) (see FIG. 1). Similarly, during the overall film formation, the film-forming apparatus 1 repeatedly moves the second nozzle 71 of the second nozzle gas discharge mechanism 70 between the one second nozzle movement end N21 and the other second nozzle movement end N22 (an approximately 90-degree range of movement). In other words, as the discharge condition of the film-forming gas for the overall film formation, the range of movement of the nozzle gas discharge mechanism 50 is set to the maximum range of the repeated movement. Thereby, the first head 63 and the second head 73 can form a film on the overall surface of the substrate W while swinging over the overall surface of the substrate W.

Figures 8A, 8B:
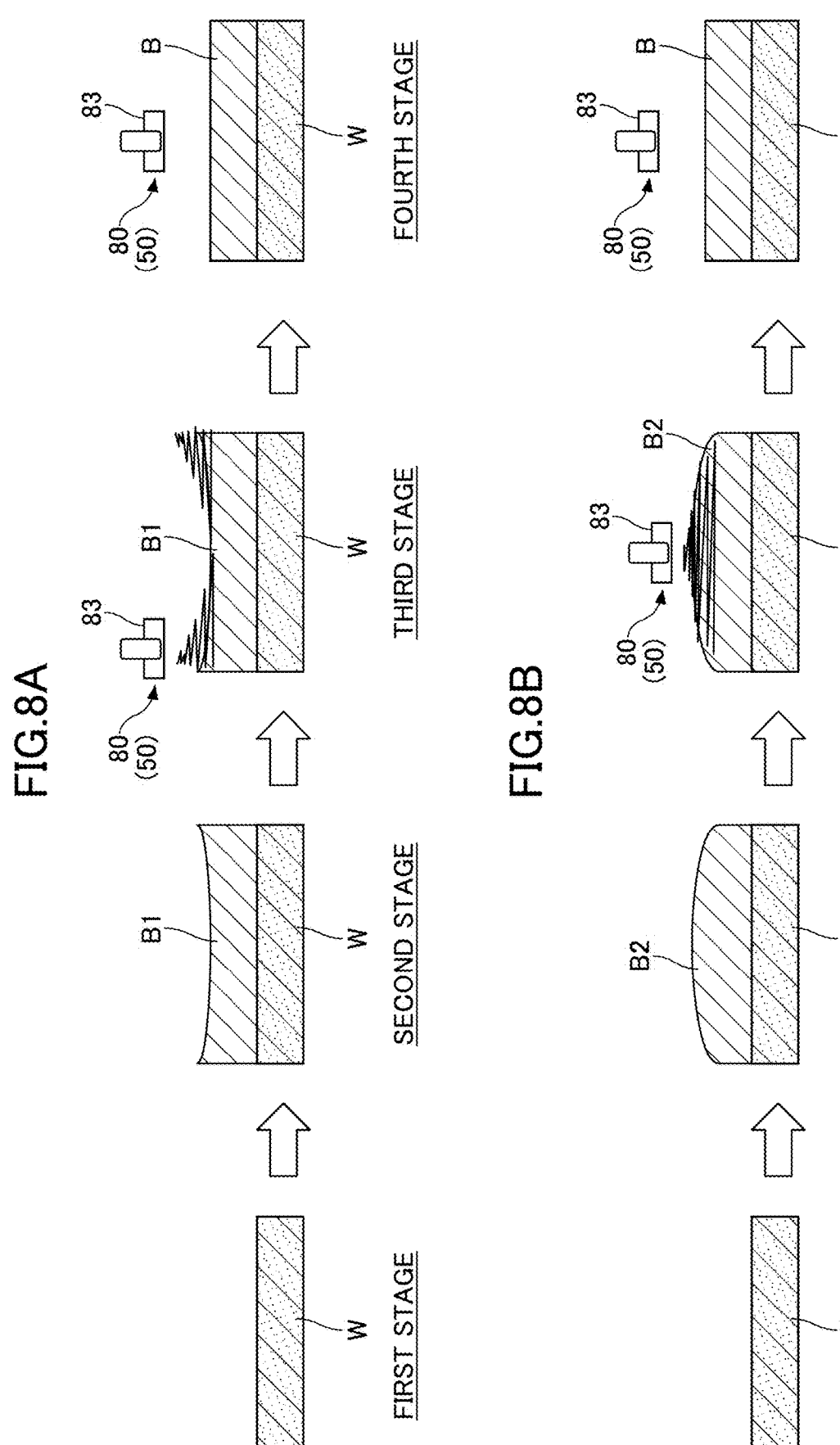
FIG. 8A is a schematic side diagram illustrating an example of adjusting a film formed in a recessed shape to a flat shape in a film-forming method according to an embodiment of the present disclosure.
FIG. 8B is a schematic side diagram illustrating an example of adjusting a film formed in a projecting shape to a flat shape in the film-forming method.

However, when the projecting and recessed pattern is formed at the substrate W as described above, a recessed film B1 as illustrated in FIG. 8A or a projecting film B2 as illustrated in FIG. 8B is formed on the surface of the substrate W through the overall film formation. Therefore, the film-forming apparatus 1 performs the partial etching after the overall film formation, thereby reducing the film thickness in a thick-film region. The film-forming apparatus 1 narrows the range of the repeated movement of the third head 83 as described above, as the discharge condition of the etching gas for the partial etching.

Specifically, in a state in which the film-forming apparatus 1 forms the recessed film B1 through the overall film formation illustrated in the first and second stages of FIG. 8A, the film-forming apparatus 1 narrows the range of the repeated movement of the third nozzle gas discharge mechanism 80 for the partial etching illustrated in the third stage of FIG. 8A to be a range of from the outer edge of the substrate W to a position before the third nozzle gas discharge mechanism 80 reaches the center of the substrate W. That is, the third nozzle gas discharge mechanism 80 is adjusted to perform etching of the film on the outer edge side on which the recessed film B1 is projecting (larger in the film thickness). Further, the film-forming apparatus 1 performs control of gradually narrowing the range of the repeated movement of the third head 83 over time. Specifically, the range of the repeated movement of the third head 83 is narrowed such that the end of the repeated movement of the third head 83 in the region closer to the center of the substrate W is gradually shifted toward the outer edge of the substrate W.

The time (discharge condition) during which the discharge holes 833*b* of the third head 83 face the substrate W can be set, for example, in accordance with the difference in the film thickness between the substrate W without the projecting and recessed pattern and the substrate W with the projecting and recessed pattern. For example, when the film thickness in the region closer to the center obtained by processing the substrate W with the projecting and recessed pattern becomes smaller due to the loading effect, the rotation speed of the substrate support 20 and the speed of movement of the third nozzle gas discharge mechanism 80 may be calculated from the difference in the film thickness from the substrate W without the projecting and recessed pattern, and control may be performed in accordance with the calculation result. The surface area of the substrate W may vary with the film thickness of the film formed on the projecting and recessed pattern in the actual overall film formation, and the calculation result may differ from the previous calculation result. Therefore, the number of cycles of the partial etching (processing period) and the range of the partial etching may be determined by monitoring the actual state of the film formed on the substrate W. Through several repeated iterations, the film-forming apparatus 1 can set an optimize discharge condition to achieve a desired film thickness and excellent in-plane uniformity.

Thereby, the film-forming apparatus 1 can reduce the film thickness of the film on the outer edge side through the partial etching compared to that of the recessed film formed through the overall film formation. As a result, the film-forming apparatus 1 can achieve a film thickness of a flat shape (a film with excellent in-plane uniformity) as illustrated in the fourth stage of FIG. 8A.

Also, in a state in which the film-forming apparatus 1 forms the projecting film B2 through the overall film formation illustrated in the first and second stages of FIG. 8B, the film-forming apparatus 1 determines the range of the repeated movement of the third nozzle gas discharge mechanism 80 for the partial etching illustrated in the third stage of FIG. 8B to be a range in which the third nozzle gas discharge mechanism 80 passes over the center of the substrate W and does not reach the outer edges of the substrate W. That is, the third nozzle gas discharge mechanism 80 is adjusted to perform etching of the film in the region closer to the center on which the projecting film B2 is projecting (larger in the film thickness). Further, the film-forming apparatus 1 performs control of gradually narrowing the range of the repeated movement of the third head 83 over time. Specifically, the range of the repeated movement of the third head 83 is narrowed such that both ends of the repeated movement of the third head 83 are gradually shifted toward the center of the substrate W.

Thereby, the film-forming apparatus 1 can reduce the film thickness of the film in the region closer to the center through the partial etching compared to that of the projecting film B2 formed through the overall film formation. As a result, the film-forming apparatus 1 can achieve a film thickness of a flat shape (a film with excellent in-plane uniformity) as illustrated in the fourth stage of FIG. 8B. In this manner, the film-forming apparatus 1 can achieve desired adjustment of the film thickness of the film formed on the substrate W by performing the partial etching.

Film-Forming Method

In the following, a film-forming method according to the above embodiment will be described with reference to the flowchart illustrated in FIG. 9. According to the film-forming method, as illustrated in FIG. 9, after a step of preliminary preparation for film formation is performed, a film-forming step, i.e., the overall film formation, and an etching step, i.e., the partial etching, are performed in this order.

Figure 9:
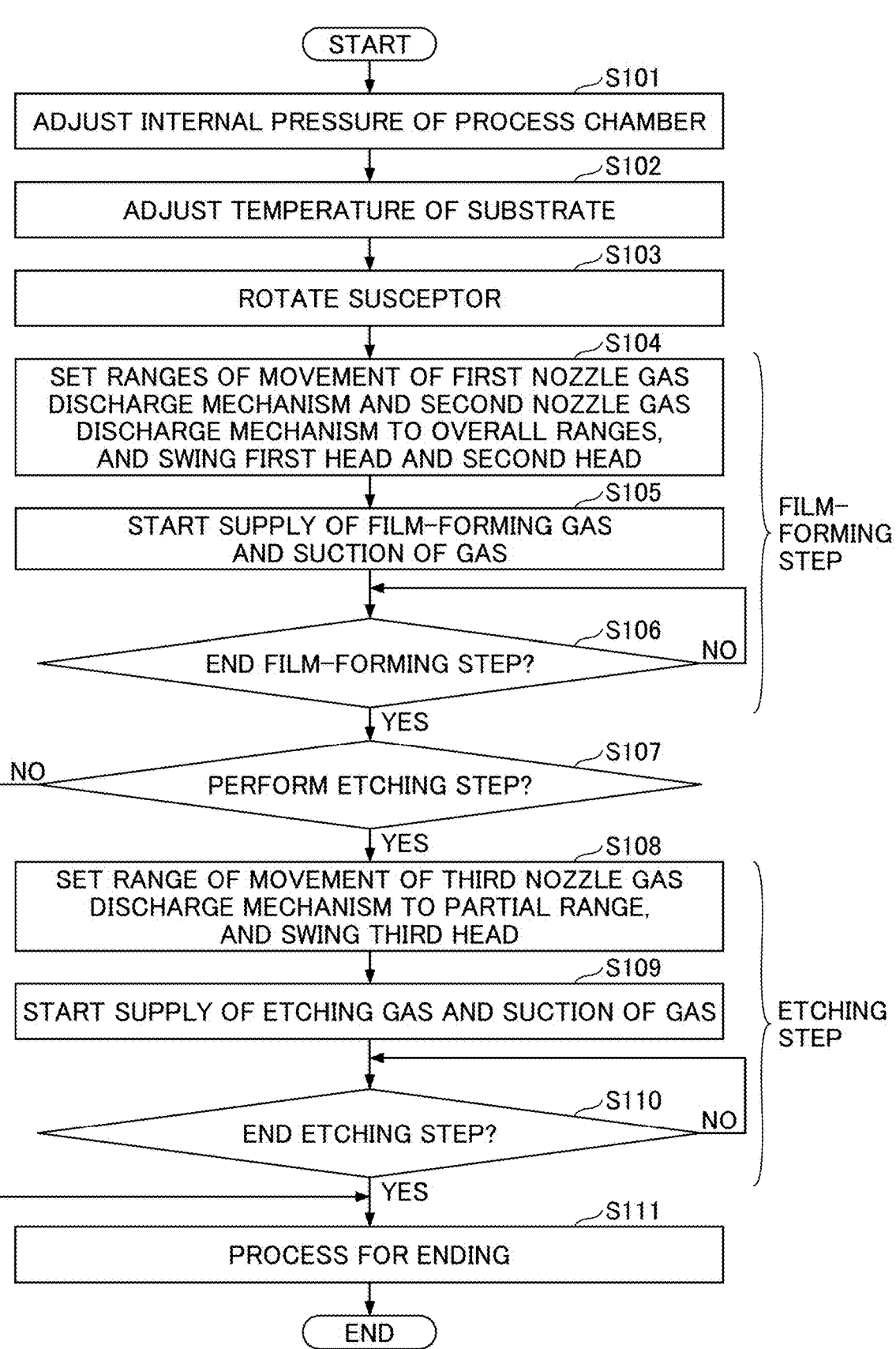
FIG. 9 is a flowchart illustrating an example of the film-forming method according to the embodiment.

More specifically, the film-forming apparatus 1 performs, under the control of the controller 90, steps S101 to S110 illustrated in FIG. 9. After the controller 90 places the substrate W on the susceptor 21 of the substrate support 20, the controller 90 first adjusts the internal pressure of the process chamber 10 to a target pressure (step S101). While supplying the purge gas from above the process chamber 10 by means of the gas supply 30, the controller 90 exhausts the internal gas from the gas exhauster 40. The controller 90 adjusts the internal pressure of the process chamber 10 to the target pressure that is set, for example, in the range of from 1 Torr through 10 Torr.

Also, the controller 90 drives the temperature controller 14 in the process chamber 10, thereby adjusting the temperature of the substrate W placed on the susceptor 21 to the target temperature (step S102). The controller 90 adjusts the temperature of the substrate W to the target temperature that is set, for example, in the range of from about 100° C. through 800° C.

Then, the controller 90 drives the substrate rotator 23 of the substrate support 20, thereby rotating the susceptor 21 at a target speed (step S103). The controller 90 rotates the susceptor 21 at a target speed that is set, for example, in the range of from 10 rpm through 1,000 rpm. Thereby, the substrate W held by the susceptor 21 also rotates (spins) with the center thereof being a rotation axis.

When the internal pressure of the process chamber 10, the temperature of the substrate W, the rotation speed of the substrate W, and the like are stabilized, the controller 90 ends the preliminary preparation and starts the film-forming step, i.e., the overall film formation. The controller 90 sets the ranges of movement of the first nozzle gas discharge mechanism 60 and the second nozzle gas discharge mechanism 70 to the overall ranges, and swings the first head 63 and the second head 73 (step S104). Thereby, the first head 63 and the second head 73 swing over the substrate W so as to face the overall surface of the substrate W. At this time, the controller 90 shifts the timing of the swing of the first head 63 and the swing of the second head 73, thereby avoiding interference between the first head 63 and the second head 73.

Then, the controller 90 drives the gas supply 30 and the gas exhauster 40 together with the driving of the nozzle gas discharge mechanism 50, thereby starting supply of the film-forming gases (adsorbing gas, reactive gas) and suction of gas using the nozzle gas discharge mechanism 50 (step S105). No particular limitation is imposed on the timings of driving of the gas supply 30 and the gas exhauster 40. The timings of driving of the gas supply 30 and the gas exhauster 40 may be before or after the repeated movement of the first nozzle 61 and the second nozzle 71. Thereby, the adsorbing gas is adsorbed on the surface of the substrate W, and the reactive gas can react with the adsorbing gas. Therefore, a film corresponding to the adsorbing gas and the reactive gas is formed on the overall surface of the substrate W.

Then, the controller 90 monitors whether or not to end the film-forming step during the film formation (step S106). For example, the controller 90 compares the target time of the film-forming step set in recipes or the like (or the processing time set in accordance with the target film thickness or the like) with the actual driving time of the nozzle gas discharge mechanism 50, and determines whether or not to end the film-forming step in accordance with the actual driving time reaching the target time. The film-forming apparatus 1 may include, in the process chamber 10, an unillustrated film thickness measuring device configured to measure the film thickness, and determine whether or not to end the film-forming step in accordance with the measured film thickness.

Next, the controller 90 determines whether or not to perform the etching step, i.e., the partial etching (step S107). As described above, a recessed film or a projecting film may be formed on the substrate W during the film-forming step. The state of the film on the substrate W (e.g., a recessed or projecting shape, a difference in thickness between the region closer to the center and the outer edge side, and the like) can be identified in advance by previously performing an experiment, simulation, or the like.

For example, when a recessed or projecting film is formed in an attempt to form a film having a flat shape as the target shape, the controller 90 determines that an etching step is performed (step S107: YES), and causes the process to proceed to step S108. Meanwhile, when a flat film is obtained in an attempt to form a film having a flat shape as the target shape, the controller 90 determines that a second film-forming step is not performed (step S107: NO), and causes the process to proceed to step S111 without performing subsequent steps S108 to S110.

In step S108, the controller 90 sets the range of movement of the third nozzle gas discharge mechanism 80 and swings the third head 83 as the etching step. For example, when a recessed film is formed as illustrated in FIG. 8A, the controller 90 narrows the range of movement of the third head 83 to be a range of from the outer edge of the substrate W to a position before the third head 83 reaches the center of the substrate W, and swings the third head 83. At this time, the controller 90 stops the swing of the first nozzle gas discharge mechanism 60 and the second nozzle gas discharge mechanism 70, and stops the discharge of the film-forming gas. Meanwhile, when a projecting film is formed as illustrated in FIG. 8B, the controller 90 narrows the range of movement of the third head 83 to be a range in which the third head 83 passes over the center of the substrate W and does not reach the outer edges of the substrate W, and swings the third head 83.

Then, in step S109, the controller 90 drives the gas supply 30 and the gas exhauster 40, thereby starting supply of the etching gas to the third nozzle gas discharge mechanism 80 and suction of the gas. Thereby, the film-forming apparatus 1 can perform etching of the film B1 along the circumferential direction, i.e., the projection on the outer edge side of the substrate W, or can perform etching of the film B2, i.e., the projection in the region closer to the center of the substrate W (see FIGS. 8A and 8B). Then, by gradually narrowing the ranges of movement of the first head 63 and the second head 73, the controller 90 can preferentially perform etching for the regions in which the film thickness of the film is larger.

The controller 90 monitors whether or not to end the etching step during the etching step (step S110). For example, the controller 90 compares the target time of the etching step set in recipes or the like (or the processing time set in accordance with the target film thickness or the like) with the actual driving time of the third nozzle gas discharge mechanism 80, and determines whether or not to end the etching step in accordance with the actual driving time reaching the target time. The target time of the etching step can be set by previously performing an experiment, simulation, or the like using the state of the film on the substrate W (e.g., a difference in thickness between the region closer to the center and the outer edge side).

Finally, the controller 90 ends the film-forming method by performing a process for ending of the film-forming apparatus 1 (step S111). The process for ending includes stopping the driving of the third nozzle gas discharge mechanism 80, and stopping the rotation of the substrate support 20, the supply of the gas by the gas supply 30, the temperature control by the temperature controller 14, and the like. Thereby, the film-forming apparatus 1 can carry the substrate W out of the process chamber 10.

The film-forming apparatus 1 and the film-forming method according to the embodiments are not limited to the above-described embodiments, and various modified examples thereof are possible. For example, the film-forming method according to the embodiment performs an etching step using the third nozzle gas discharge mechanism 80 dedicated for discharging an etching gas. However, the film-forming apparatus 1 may perform the etching step using another nozzle gas discharge mechanism. As an example, by using the second nozzle gas discharge mechanism 70 configured to discharge the reactive gas, the film-forming apparatus 1 can discharge the etching gas from the discharge hole 733b of the second head 73 while repeatedly moving the second nozzle gas discharge mechanism 70 in the etching step. At this time, the film-forming apparatus 1 can successfully perform the partial etching by setting the range of the repeated movement of the second nozzle gas discharge mechanism 70 in the same manner as in the above-described embodiment.

According to the film-forming method according to the above-described embodiment, the range of the repeated movement of the third nozzle gas discharge mechanism 80 is made narrower than the maximum range of the third nozzle gas discharge mechanism 80, as the discharge condition of the etching gas in the etching step. However, this is by no means a limitation. The film-forming method may change the discharge condition of the etching gas, for example, increasing the time for which the third nozzle gas discharge mechanism 80 faces the substrate W in a region in which the film thickness of the film is larger, increasing the discharge amount of the etching gas supplied to the substrate W, or the like. That is, the conditions of the etching step may be set by appropriately combining, for example: the driving of the third nozzle gas discharge mechanism 80 for reducing the film formed to have a large film thickness; the rotation speed on the substrate W side; discharge conditions, such as the discharge amount of the etching gas, and the like. Therefore, for example, the etching step of the film-forming method can increase the etching level by increasing the discharge amount of the etching gas in the region in which the film thickness of the film is larger and decreasing the rotation speed of the substrate W without limiting the range of movement of the third nozzle gas discharge mechanism 80. In this case, the film-forming method can appropriately adjust the film thickness of the film to be formed.

Figure 10A:
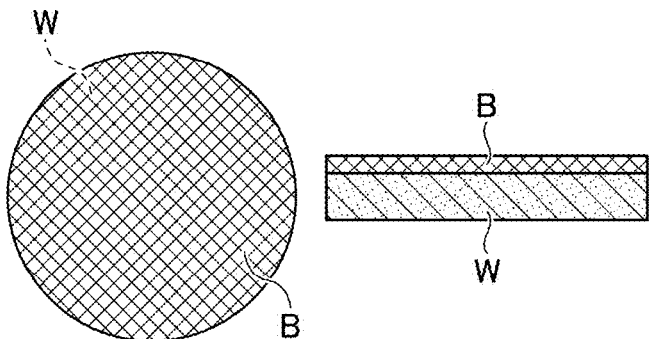
FIGS. 10A to 10I are diagrams illustrating a target shape of a film formed on a substrate.

The above-described embodiment has been described taking, as an example, the film B having a flat shape as illustrated in FIG. 10A as the final target shape of the film to be formed on the surface of the substrate W. However, the final target shape of the film to be formed on the surface of the substrate W is not limited to a flat shape, and may be set to various shapes as illustrated in FIGS. 10B to 10I.

Figure 10B:
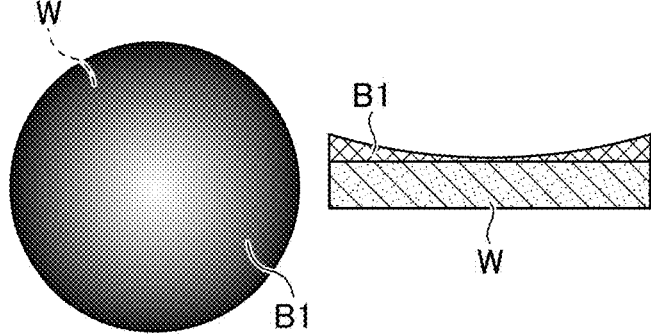
Figure 10C:
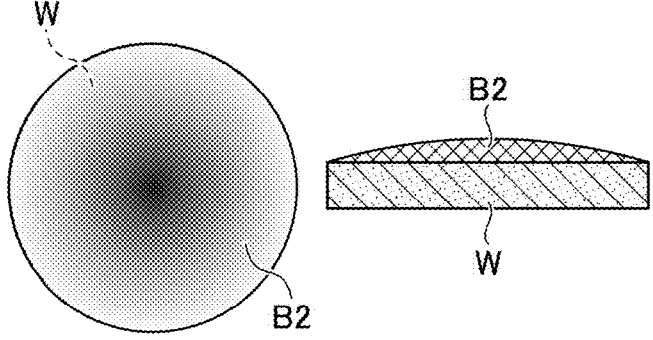
Figure 10D:
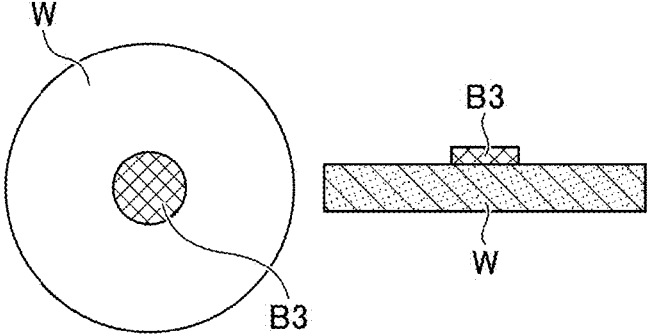
Figure 10E:
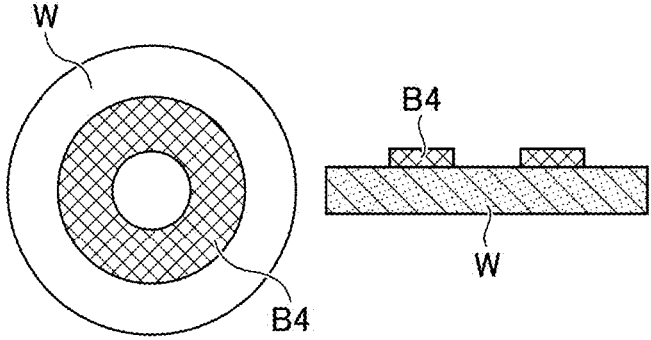
Figure 10F:
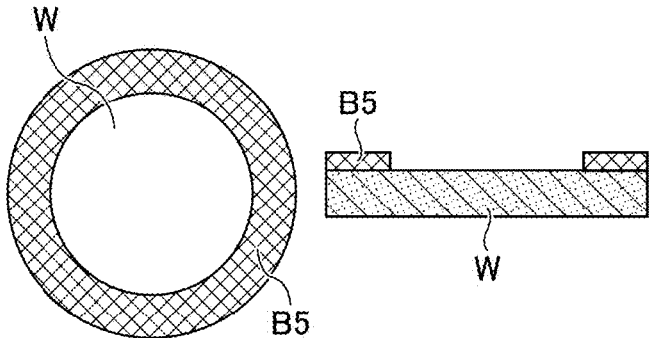

For example, FIG. 10B illustrates an example of the target shape, i.e., the recessed film B1 in which the film thickness thereof in the region closer to the center of the substrate W is smaller while the film thickness thereof on the outer edge side of the substrate W is larger. FIG. 10C illustrates an example of the target shape, i.e., the projecting film B2 in which the film thickness thereof in the region closer to the center of the substrate W is larger while the film thickness thereof on the outer edge side of the substrate W is smaller. FIG. 10D illustrates an example of the target shape, i.e., a circular film B3 that is formed in the region closer to the center of the substrate W. FIG. 10E illustrates an example of the target shape, i.e., a film B4 that is annularly formed to pass through the middle position of the radius of the substrate W. FIG. 10F illustrates an example of the target shape, i.e., a film B5 that is annularly formed at the outer edge of the substrate W.

Figure 10G:
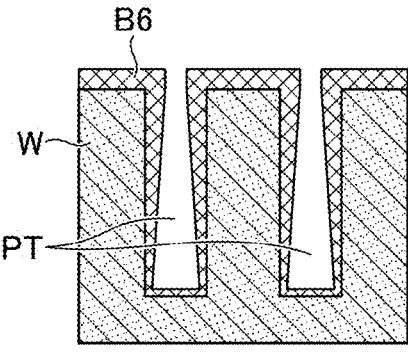
Figure 10H:
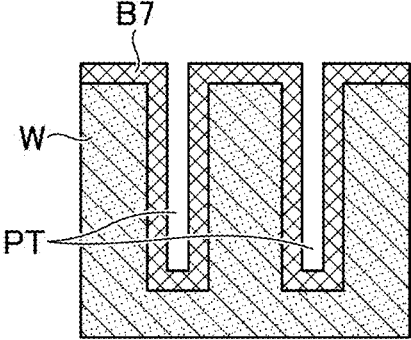
Figure 10I:
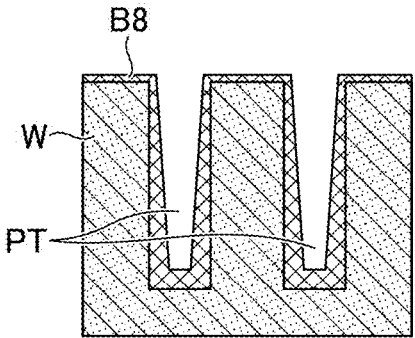

Basically, the film-forming method forms a conformal film B7 having a constant film thickness on the inner wall and the bottom wall of each of the projections and recesses in the projecting and recessed pattern PT, as illustrated in FIG. 10H. However, the film-forming method is not limited to forming the conformal film B7. For example, as illustrated in FIG. 10G, the film-forming method may form an overhang film B6 in which the film thickness thereof is larger toward openings in the projecting and recessed pattern PT. Also, as illustrated in FIG. 10I, for example, the film-forming method may form a bottom-up film B8 in which the film thickness thereof is larger near the bottom walls (deeper regions) of the projections and recesses in the projecting and recessed pattern PT.

Figure 11:
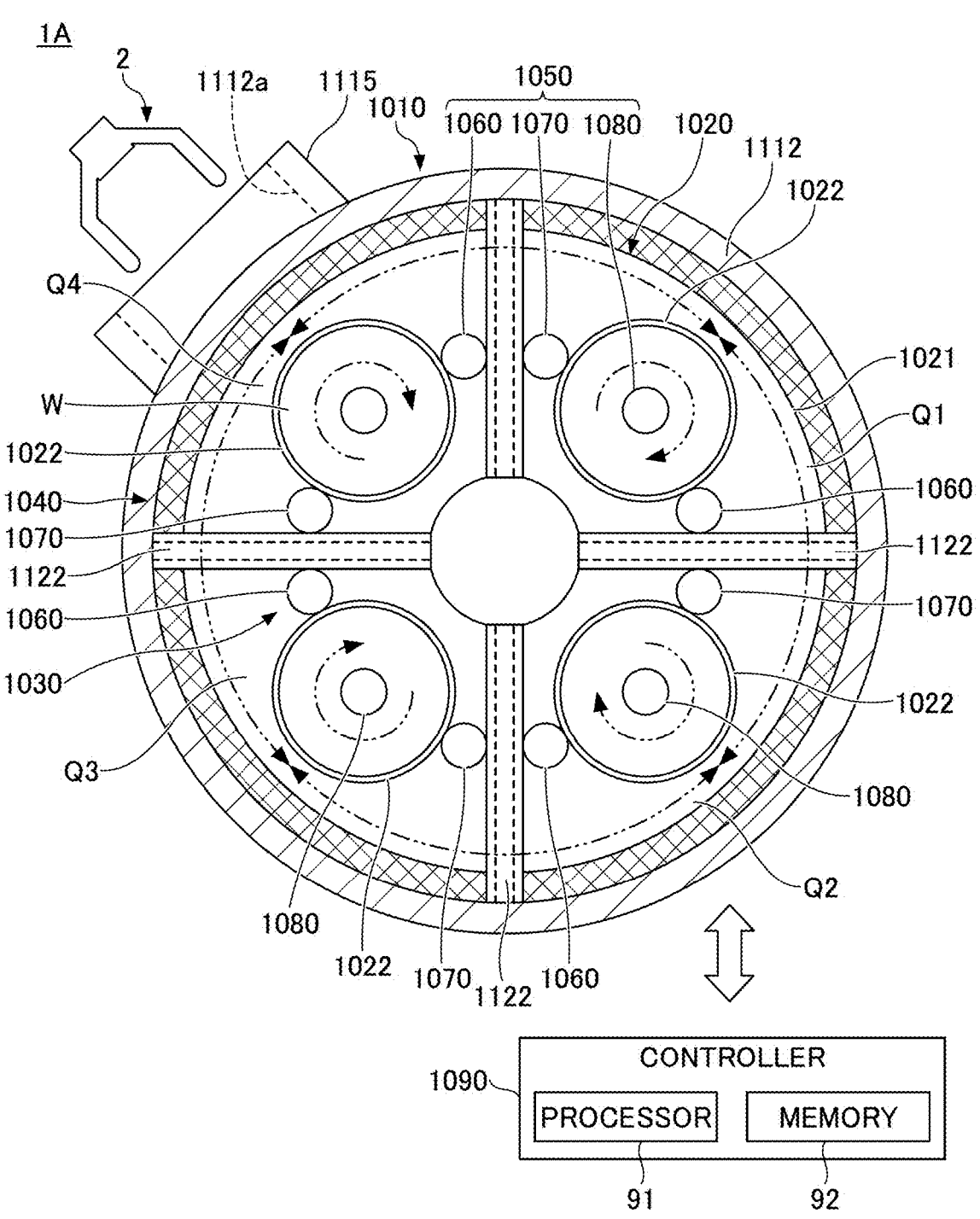
FIG. 11 is a plan diagram illustrating a film-forming apparatus according to a modified example of the embodiment of the present disclosure.

According to the film-forming apparatus 1 according to the above-described embodiment, the first nozzle gas discharge mechanism 60, the second nozzle gas discharge mechanism 70, and the third nozzle gas discharge mechanism 80 move (swing) relative to the substrate W. However, this is by no means a limitation. The film-forming apparatus 1 may be configured such that a nozzle gas discharge mechanism configured to supply the film-forming gas or etching gas is fixed and the substrate support 20 configured to support the substrate W moves relative to the nozzle. FIG. 11 illustrates an example of a film-forming apparatus 1A in this case.

The film-forming apparatus 1A according to a modified example illustrated in FIG. 11 includes a process chamber 1010, a substrate support 1020, a gas supply 1030, a gas exhauster 1040, and a nozzle gas discharge mechanism 1050. In FIG. 11, illustration of a top plate of the process chamber 1010 is omitted for the sake of convenience.

The process chamber 1010 is formed of quartz or the like, and has an inner space that can house multiple substrates W and can be reduced in pressure. The process chamber 1010 has a regular circular shape in a plan view, and is formed in a cylindrical shape having a vertical length shorter than a horizontal diameter. The process chamber 1010 is provided with a side opening 1112a in a side wall 1112 for entry and retreat of the carrier 2 configured to carry the substrate W. The side wall 1112 is provided with a gate valve 1015 configured to open and close the side opening 1112a.

The substrate support 1020 holds multiple (e.g., four in FIG. 13) substrates W housed in the process chamber 1010 so as to be rotatable and spinnable. Therefore, the substrate support 1020 includes a rotation table 1021 and multiple (e.g., four) stages 1022 configured to support the substrates W on the surface of the outer peripheral portion of the rotation table 1021. The four stages 1022 are provided at the same distance (radial positions) away from the center of the rotation table 1021, and are arranged at equal intervals (i.e. every 90 degrees) along the circumferential direction. The substrate support 1020 repeatedly moves the rotation table 1021 in the circumferential direction. For example, the substrate support 1020 rotates the rotation table 1021 clockwise by 90° in FIG. 11, and then rotates the rotation table 1021 counterclockwise by 90° in FIG. 11.

The gas supply 1030 has unillustrated multiple supply paths configured to flow gases, such as the film-forming gases (adsorbing gas, reactive gas), a purge gas, and the like, externally of the process chamber 1010, and supplies the gases into the process chamber 1010 through the respective supply paths. The gas exhauster 1040 has unillustrated multiple exhaust paths configured to flow gases (e.g., a reacted gas, an unreacted gas, a purge gas, and the like) externally of the process chamber 1010, and exhaust the gases supplied into the process chamber 1010 through the respective exhaust paths.

The nozzle gas discharge mechanism 1050 is configured to discharge the film-forming gases or the etching gas to the surface (front surface) of the substrates W at an appropriate position in the process chamber 1010, and suction the gas over the substrate W. Specifically, the nozzle gas discharge mechanism 1050 includes a first nozzle 1060 configured to discharge the adsorbing gas and the purge gas, a second nozzle 1070 configured to discharge the reactive gas and the purge gas, and a third nozzle 1080 configured to discharge the etching gas and the purge gas. Four first nozzles 1060, four second nozzles 1070, and four third nozzles 1080 are provided in the process chamber 1010.

The first nozzles 1060 and the second nozzles 1070 are fixed to four partition wall members 1122. For example, each of the partition wall members 1122 holds the first nozzle 1060 on the side surface located counterclockwise in FIG. 11, while holding the second nozzle 1070 on the side surface located clockwise in FIG. 11. In other words, one of the first nozzles 1060 and one of the second nozzles 1070 are disposed in each of the first quadrant Q1 to the fourth quadrant Q4 partitioned by the partition wall members 1122.

Meanwhile, the third nozzle 1080 is disposed at an intermediate position of each of the first quadrant Q1 to the fourth quadrant Q4, i.e., at a position away from the first nozzle 1060 and the second nozzle 1070, and is fixed to the top plate of the process chamber 1010.

Each of the first nozzle 1060, the second nozzle 1070, and the third nozzle 1080 penetrates through the top plate of the process chamber 1010, and is connected to the gas supply 1030 and the gas exhauster 1040 externally of the process chamber 1010. The first nozzle 1060 and the second nozzle 1070 perform gas discharge and suction on the vertically lower side in the process chamber 1010. The configuration of discharging and suctioning the adsorbing gas in the first nozzle 1060 is substantially the same as that of the first head 63 according to the embodiment. The configuration of discharging and suctioning the reactive gas in the second nozzle 1070 is substantially the same as that of the second head 73 according to the embodiment. The configuration of discharging and suctioning the etching gas in the third nozzle 1080 is substantially the same as that of the third head 83 according to the embodiment. Thereby, the first processing point region PR1 (see FIG. 3A) is formed on the vertically lower side in the first nozzle 1060. The second processing point region PR2 (see FIG. 4A) is formed on the vertically lower side in the second nozzle 1070. The third processing point region PR3 (see FIG. 5A) is formed on the vertically lower side in the third nozzle 1080.

The center of the first nozzle 1060, the center of the second nozzle 1070, and the center of the third nozzle 1080 face the center of the stage 1022 provided on the rotation table 1021. Thereby, the first nozzle 1060, the second nozzle 1070, and the third nozzle 1080 pass over the center of the substrate W, placed on the stage 1022, on the vertically upper side of the substrate W in accordance of rotation of the rotation table 1021. The stage 1022 is spinning during film formation, and thus the first nozzle 1060, the second nozzle 1070, and the third nozzle 1080 can face the overall surface of the substrate W.

A controller 1090 of the film-forming apparatus 1A performs a film-forming method on the substrate W on the stage 1022 by repeatedly moving the rotation table 1021 clockwise and counterclockwise while rotating (spinning) the stage 1022. That is, according to the film-forming method, the substrate W is moved relative to the first nozzle 1060 and the second nozzle 1070 that are fixed, thereby forming a film on the surface of the substrate W.

The controller 1090 performs a film-forming step and an etching step similar to the processing flow of the film-forming method illustrated in FIG. 9. That is, the film-forming step performs overall film formation in which a film is formed on the overall surface of the substrate W by means of the first nozzle 1060 and the second nozzle 1070 by repeatedly moving the rotation table 1021 clockwise and counterclockwise in a range of 90°. The etching step performs partial etching in which etching of a part (e.g., the outer edge) of the surface of the substrate W is performed by means of the third nozzle 1080 by repeatedly moving the rotation table 1021 after narrowing the ranges of clockwise and counterclockwise movements of the rotation table 1021. Thereby, the film-forming apparatus 1A and the film-forming method can appropriately control the film formation such that the film on the surface of the substrate W has a target shape.

The technical ideas and effects of the present disclosure described in the above-described embodiments will be described below.

A first aspect of the present disclosure provides a film-forming method for forming a film on the substrate W. The film-forming method includes: (A) forming the film on the substrate W by, in the process chamber 10, rotating the substrate W, moving one of the substrate W or the nozzle gas discharge mechanism 50 relative to another of the substrate W or the nozzle gas discharge mechanism 50 such that the discharge holes 633b and 733b of the nozzle gas discharge mechanism 50 pass over the center of the substrate W, and discharging the film-forming gas toward the substrate W from the discharge holes 633b and 733b of the nozzle gas discharge mechanism 50; and (B) after (A), adjusting a film thickness of the film formed on the substrate W by, in the process chamber 10, rotating the substrate W, moving one of the substrate W or the nozzle gas discharge mechanism 50 relative to another of the substrate W or the nozzle gas discharge mechanism 50 such that the discharge holes 833b of the nozzle gas discharge mechanism 50 pass over the center of the substrate W, and discharging the etching gas toward the substrate W from the discharge holes 833b of the nozzle gas discharge mechanism 50.

According to the above, the film-forming method can readily form the film having a desired film thickness on the substrate W with high accuracy by, after (A), performing (B), i.e., adjusting the film thickness of the film formed on the substrate W. That is, even if the film thickness of the film formed in (A) is not that of the target shape, the film-forming method can adjust the film thickness in (B) to be closer to that of the target shape. In other words, the film-forming method can perform (A) and (B), thereby performing film formation through desired adjustment of film shapes including the film thickness.

Also, the discharge condition of the etching gas is set in (B) such that the discharge holes 833b face, for a longer time, a region in which the film thickness of the film formed in (A) is larger than the film thickness of the target shape. Thereby, the film-forming method can perform etching by supplying a larger amount of the etching gas to the region in which the film thickness of the film is larger than a desired film thickness, and can readily achieve a desired film thickness.

Also, in (B), the range in which one of the substrate W or the nozzle gas discharge mechanism 50 is moved relative to another of the substrate W or the nozzle gas discharge mechanism 50 is set to be shorter than the diameter of the substrate W. Thereby, the film-forming method can intensively supply the etching gas to a narrow range, and stably perform partial adjustment of the film thickness of the substrate W.

In (B), the range in which one of the substrate W or the nozzle gas discharge mechanism 50 is moved relative to another of the substrate W or the nozzle gas discharge mechanism 50 is gradually narrowed over time. Thereby, the film-forming method can narrow the range of movement in accordance with the region in which the film thickness is large, and further successfully perform the partial adjustment of the film thickness of the substrate W.

In (B), the range in which one of the substrate W or the nozzle gas discharge mechanism 50 is moved relative to another of the substrate W or the nozzle gas discharge mechanism 50 is set to a range in which the discharge holes 833b pass over the center of the substrate W and do not reach the outer edge of the substrate W. Thereby, the film-forming method can adjust the film thickness by stably performing etching of the film in the region closer to the center of the substrate W.

In (B), the range in which one of the substrate W or the nozzle gas discharge mechanism 50 is moved relative to another of the substrate W or the nozzle gas discharge mechanism 50 is set to a range in which the discharge holes 833b pass over the outer edge of the substrate W yet do not reach the center of the substrate W. Thereby, the film-forming method can adjust the film thickness by stably performing etching of the film on the outer edge side of the substrate W.

In (B), the speed at which one of the substrate W or the nozzle gas discharge mechanism 50 is moved relative to another of the substrate W or the nozzle gas discharge mechanism 50 is changed in accordance with the position of the substrate W faced by the discharge holes 833b. Thereby, for example, the film-forming method can address factors, such as, for example, the surface area increasing toward the outer edge of the substrate W, by changing the speed of the relative movement. This enables further stable film formation for forming a film on the substrate W to have the target shape.

Also, the nozzle gas discharge mechanism 50 includes: the first nozzle gas discharge mechanism 60 and the second nozzle gas discharge mechanism 70 that are configured to discharge the film-forming gas to the substrate; and the third nozzle gas discharge mechanism 80 configured to discharge the etching gas to the substrate W. In (A), in a state in which the substrate W is being rotated, the first nozzle gas discharge mechanism 60 and the second nozzle gas discharge mechanism 70 are caused to swing independently of each other. In (B), in a state in which the substrate W is being rotated, only the third nozzle gas discharge mechanism 80 is caused to swing. Thereby, the film-forming method can readily swing the third nozzle gas discharge mechanism 80 and supply the etching gas to the substrate W.

The first nozzle gas discharge mechanism 60 includes: the first nozzle 61 extending in the process chamber 10; the first nozzle driver 62 provided at the base end of the first nozzle 61 and configured to swing the first nozzle 61; and the first head 63 provided at the front end of the first nozzle 61 and configured to discharge the adsorbing gas as the film-forming gas. The second nozzle gas discharge mechanism 70 includes: the second nozzle 71 extending in the process chamber 10; the second nozzle driver 72 provided at the base end of the second nozzle 71 and configured to swing the second nozzle 71; and the second head 73 provided at the front end of the second nozzle 71 and configured to discharge, as the film-forming gas, the reactive gas that is reactive with the adsorbing gas. The third nozzle gas discharge mechanism 80 includes: the third nozzle 81 extending in the process chamber 10; the third nozzle driver 82 provided at the base end of the third nozzle 81 and configured to swing the third nozzle 81; and the third head 83 provided at the front end of the third nozzle 81 and configured to discharge the etching gas. Thereby, the film-forming method can supply the adsorbing gas, the reactive gas, and the etching gas in the circumferential direction of the substrate W in a pinpointed manner, and can form a desired film with high accuracy.

A second aspect of the present disclosure is a film-forming apparatus 1 or 1A configured to form a film on a substrate W. The film-forming apparatus 1 or 1A includes: the process chamber 10 configured to house the substrate W; the substrate support 20 configured to support the substrate W in the process chamber 10 and rotate the substrate W; the nozzle gas discharge mechanism 50 configured to discharge a film-forming gas and an etching gas toward the substrate W supported by the substrate support 20; and the controller 90 configured to control movements of the substrate support 20 and the nozzle gas discharge mechanism 50. The controller 90 is configured to control: (A) forming the film on the substrate W by, in the process chamber 10, rotating the substrate W, moving one of the substrate W or the nozzle gas discharge mechanism 50 relative to another of the substrate W or the nozzle gas discharge mechanism 50 such that the discharge holes 633b and 733b of the nozzle gas discharge mechanism 50 pass over the center of the substrate W, and discharging the film-forming gas toward the substrate W from the discharge holes 633b and 733b of the nozzle gas discharge mechanism 50; and (B) after (A), adjusting a film thickness of the film formed on the substrate W by, in the process chamber 10, rotating the substrate W, moving one of the substrate W or the nozzle gas discharge mechanism 50 relative to another of the substrate W or the nozzle gas discharge mechanism 50 such that the discharge holes 833b of the nozzle gas discharge mechanism 50 pass over the center of the substrate W, and discharging the etching gas toward the substrate W from the discharge holes 833b of the nozzle gas discharge mechanism 50. In this case, the film-forming apparatus 1 or 1A can readily form a film to have a desired film thickness with high accuracy.

The film-forming method and the film-forming apparatuses 1 and 1A according to the embodiment disclosed herein are illustrative in all respects and are not limiting. The embodiments can be modified and improved in various ways without departing from the scope of claims recited and the subject matters thereof. The matters described in the above embodiments can take other configurations to an extent without involving contradiction and may be combined to an extent without involving contradiction.

According to an embodiment, it is possible to readily form a film to have a desired film thickness with high accuracy.

What is claimed is:

1. A film-forming method for forming a film on a substrate, the film-forming method comprising:

(A) forming the film on the substrate by, in a process chamber, rotating the substrate, moving one of the substrate or a nozzle gas discharge mechanism relative to another of the substrate or the nozzle gas discharge mechanism such that a discharge hole of the nozzle gas discharge mechanism passes over a center of the substrate, and discharging a film-forming gas toward the substrate from the discharge hole of the nozzle gas discharge mechanism; and (B) after (A), adjusting a film thickness of the film formed on the substrate by, in the process chamber, rotating the substrate, moving one of the substrate or the nozzle gas discharge mechanism relative to another of the substrate or the nozzle gas discharge mechanism such that the discharge hole of the nozzle gas discharge mechanism passes over the center of the substrate, and discharging an etching gas toward the substrate from the discharge hole of the nozzle gas discharge mechanism.

2. The film-forming method according to claim 1, wherein in (B), a discharge condition of the etching gas is set such that the discharge hole faces, for a longer time, a region in which the film thickness of the film formed in (A) is larger than that of a target shape.

3. The film-forming method according to claim 2, wherein in (B), a range in which one of the substrate or the nozzle gas discharge mechanism is moved relative to another of the substrate or the nozzle gas discharge mechanism is set to be shorter than a diameter of the substrate.

4. The film-forming method according to claim 3, wherein in (B), the range in which one of the substrate or the nozzle gas discharge mechanism is moved relative to another of the substrate or the nozzle gas discharge mechanism is gradually narrowed over time.

5. The film-forming method according to claim 2, wherein in (B), a range in which one of the substrate or the nozzle gas discharge mechanism is moved relative to another of the substrate or the nozzle gas discharge mechanism is set to a range in which the discharge hole passes over the center of the substrate yet does not reach an outer edge of the substrate.

6. The film-forming method according to claim 2, wherein in (B), a range in which one of the substrate or the nozzle gas discharge mechanism is moved relative to another of the substrate or the nozzle gas discharge mechanism is set to a range in which the discharge hole passes over an outer edge of the substrate yet does not reach the center of the substrate.

7. The film-forming method according to claim 1, wherein in (B), a speed at which one of the substrate or the nozzle gas discharge mechanism is moved relative to another of the substrate or the nozzle gas discharge mechanism is changed in accordance with a position of the substrate faced by the discharge hole.

8. The film-forming method according to claim 1, wherein the nozzle gas discharge mechanism includes a first nozzle gas discharge mechanism and a second nozzle gas discharge mechanism that are configured to discharge the film-forming gas to the substrate, and a third nozzle gas discharge mechanism configured to discharge the etching gas to the substrate, in (A), in a state in which the substrate is being rotated, the first nozzle gas discharge mechanism and the second nozzle gas discharge mechanism are caused to swing independently of each other, and in (B), in a state in which the substrate is being rotated, only the third nozzle gas discharge mechanism is caused to swing.

9. The film-forming method according to claim 8, wherein the first nozzle gas discharge mechanism includes a first nozzle extending in the process chamber, a first nozzle driver provided at a base end of the first nozzle and configured to swing the first nozzle, and a first head provided at a front end of the first nozzle and configured to discharge an adsorbing gas as the film-forming gas, the second nozzle gas discharge mechanism includes a second nozzle extending in the process chamber, a second nozzle driver provided at a base end of the second nozzle and configured to swing the second nozzle, and a second head provided at a front end of the second nozzle and configured to discharge, as the film-forming gas, a reactive gas that is reactive with the adsorbing gas, and the third nozzle gas discharge mechanism includes a third nozzle extending in the process chamber, a third nozzle driver provided at a base end of the third nozzle and configured to swing the third nozzle, and a third head provided at a front end of the third nozzle and configured to discharge the etching gas.

10. A film-forming apparatus configured to form a film on a substrate, the film-forming apparatus comprising:

a process chamber configured to house the substrate;

a substrate support configured to support the substrate in the process chamber and rotate the substrate;

a nozzle gas discharge mechanism configured to discharge a film-forming gas and an etching gas toward the substrate supported by the substrate support; and a controller including a memory and a processor coupled to the memory, the processor being configured to control movements of the substrate support and the nozzle gas discharge mechanism, and control (A) forming the film on the substrate by, in the process chamber, rotating the substrate, moving one of the substrate or the nozzle gas discharge mechanism relative to another of the substrate or the nozzle gas discharge mechanism such that a discharge hole of the nozzle gas discharge mechanism passes over a center of the substrate, and discharging a film-forming gas toward the substrate from the discharge hole of the nozzle gas discharge mechanism; and (B) after (A), adjusting a film thickness of the film formed on the substrate by, in the process chamber, rotating the substrate, moving one of the substrate or the nozzle gas discharge mechanism relative to another of the substrate or the nozzle gas discharge mechanism such that the discharge hole of the nozzle gas discharge mechanism passes over the center of the substrate, and discharging the etching gas toward the substrate from the discharge hole of the nozzle gas discharge mechanism.

* * * * *